(12) United States Patent
Jeong

(10) Patent No.: US 8,202,764 B2
(45) Date of Patent: Jun. 19, 2012

(54) METHOD OF MANUFACTURING SEMICONDUCTOR PACKAGE

(75) Inventor: Woo-Pyo Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 12/367,596

(22) Filed: Feb. 9, 2009

(65) Prior Publication Data

US 2009/0209061 A1    Aug. 20, 2009

(30) Foreign Application Priority Data

Feb. 15, 2008  (KR) .................. 10-2008-0014048

(51) Int. Cl.
*H01L 23/48* (2006.01)
(52) U.S. Cl. ................ 438/110; 257/E23.011
(58) Field of Classification Search ............. 438/106, 438/107, 110, 113; 257/773, 734, 786, 690, 257/698, 723, E23.011, E23.141, E23.142
See application file for complete search history.

(56) References Cited

U.S. PATENT DOCUMENTS

| 5,854,508 A * | 12/1998 | Kajigaya et al. ............. 257/786 |
| 6,040,632 A   | 3/2000  | Low et al. |
| 2002/0056911 A1 * | 5/2002 | Iwaya et al. ................. 257/738 |
| 2002/0113319 A1   | 8/2002 | Ohno |
| 2002/0140107 A1 * | 10/2002 | Kato et al. ..................... 257/777 |
| 2003/0015792 A1 * | 1/2003 | Urakawa ....................... 257/724 |
| 2006/0224814 A1 * | 10/2006 | Kim et al. ........................ 711/5 |
| 2007/0102800 A1 * | 5/2007 | Kang ............................. 257/686 |

FOREIGN PATENT DOCUMENTS

| JP | 8-153861    | 6/1996 |
| JP | 2001-156171 | 6/2001 |
| JP | 2002-190526 | 7/2002 |

* cited by examiner

*Primary Examiner* — Hsien Ming Lee
*Assistant Examiner* — Michele Fan
(74) *Attorney, Agent, or Firm* — Onello & Mello, LLP

(57) ABSTRACT

Provided is a semiconductor package and method of manufacturing same. The method includes: forming a plurality of semiconductor chips which have the same pattern direction on a semiconductor substrate, each of which includes a memory cell region, a peripheral region and a pad region, and in each of which the pad region is disposed in an edge region; separating the semiconductor chips, which are formed on the semiconductor substrate, from one another; and disposing semiconductor chips, which are selected from the separated semiconductor chips, on a package substrate by changing the pattern directions of the selected semiconductor chips and arranging pad regions of the selected semiconductor chips in a center region of the package substrate.

5 Claims, 22 Drawing Sheets

METHOD OF MANUFACTURING SEMICONDUCTOR PACKAGE

CROSS REFERENCE TO RELATED APPLICATION

This application claims priority from Korean Patent Application No. 10-2008-0014048 filed on Feb. 15, 2008 in the Korean Intellectual Property Office, the disclosure of which is incorporated herein by reference in its entirety.

BACKGROUND OF THE INVENTION

1. Field of the Invention

The present invention relates to a method of manufacturing a semiconductor package and, more particularly, to a method of manufacturing a semiconductor package by flexibly changing the position of pads.

2. Description of the Related Art

Generally, a conventional semiconductor device (that is, a semiconductor package) is manufactured through a fabrication process and an assembly process. In the fabrication process, a predetermined circuit pattern is repeated on a semiconductor substrate to form a plurality of cells having integrated circuits. In the assembly process, semiconductor chips, that is, dies, each having a plurality of cells formed thereon, are packaged.

An electrical die sorting (EDS) process is performed between the fabrication process and the assembly process to inspect the electrical properties of the cells formed on the semiconductor substrate. In the EDS process, each cell on the semiconductor substrate is inspected to determine whether the cell is defective. Accordingly, the dies formed on a wafer, i.e., the semiconductor substrate, can be divided into defective and non-defective dies. After the dies are sorted, they are separated from one another. Then, one or more of the non-defective dies are packaged to produce a semiconductor device.

While semiconductor packages are rapidly becoming smaller, they are recently becoming faster and more sophisticated. Accordingly, a plurality of semiconductor devices, which perform various functions, is included in a single semiconductor package.

However, if semiconductor devices having discrete functions are integrated onto a single semiconductor chip and if the semiconductor chip is included in a single package, when any one of the semiconductor devices of the semiconductor chip is defective, the other semiconductor devices cannot be used. Thus, the number of usable semiconductor chips that can be obtained from one wafer is significantly reduced.

Semiconductor chips, on each of which a plurality of semiconductor devices having various functions are mounted, can be applied to various products. In this case, input/output pads of each semiconductor chip must be arranged in a manner that facilitates the connection of the semiconductor chip with other semiconductor chips and increases the packaging density of the semiconductor chips. That is, it would be advantageous to be able to flexibly arrange input/output pads of semiconductor chips prior to packaging.

SUMMARY OF THE INVENTION

Aspects of the present invention provide a semiconductor package, and method for making same, that includes an increased number of semiconductor chips from a single semiconductor substrate and which is manufactured by process that enables flexibly changing the positions of pads.

However, the aspects of the present invention are not restricted to those explicitly set forth herein. The above and other aspects of the present invention will become more apparent to one of ordinary skill in the art to which the present invention pertains by referencing the detailed description of the presently preferred embodiments given herein.

According to an aspect of the present invention, there is provided a method of manufacturing a semiconductor package. The method includes: forming a plurality of semiconductor chips having the same pattern direction on a semiconductor substrate, each of the semiconductor chips includes a memory cell region, a peripheral region, and a pad region, wherein the pad region is disposed in an edge region; separating the plurality of semiconductor chips from one another; and disposing selected semiconductor chips, from the separated semiconductor chips, on a package substrate, including changing the pattern directions of some of the selected semiconductor chips such that pad regions of each of the selected semiconductor chips are arrange in a center region of the package substrate.

Forming each of the plurality of semiconductor chips can include: forming a memory cell region in a center region of the semiconductor chip; forming a peripheral region in each of row and column directions of the memory cell region; and forming a pad region adjacent to a corner of the memory cell region.

Disposing selected semiconductor chips on the package substrate can include: disposing a first chip, from the selected semiconductor chips, on the package substrate such that a pad region of the first chip is placed in the center region of the package substrate; and rotating a second chip, from the selected semiconductor chips, 90 degrees with respect to the first chip and disposing the second chip such that a pad region of the second chip is adjacent to the pad region of the first chip.

Disposing the selected semiconductor chips on the package substrate can further include rotating a third chip, from the selected semiconductor chips, 180 degrees with respect to the first chip and disposing the third chip such that a pad region of the third chip is adjacent to the pad region of the second chip.

Disposing the selected semiconductor chips on the package substrate can further include rotating a fourth chip, from the selected semiconductor chips, 270 degrees with respect to the first chip and disposing the fourth chip such that a pad region of the fourth chip is adjacent to the pad region of the third chip.

Forming each of the plurality of semiconductor chips can include: forming a memory cell region in the center region of each semiconductor chip; forming a peripheral region in each of row and column directions of the memory cell region; and forming a pad region parallel to the row or column direction of the memory cell region.

Disposing the selected semiconductor chips on the package substrate can include: arranging first and second chips, from the selected semiconductor chips, in a line on the package substrate such that pad regions of the first and second chips are placed in the center region of the package substrate; and rotating third and fourth chips, from the selected semiconductor chips, 180 degrees with respect to the first chip and arranging the third and fourth chips such that pad regions of the third and fourth chips are adjacent to the pad regions of the first and second chips, respectively.

Forming each of the plurality of semiconductor chips can include: forming a plurality of memory cell regions in a line in each semiconductor chip; forming a peripheral region in each of row and column directions of each of the plurality of memory cell regions; and forming a pad region adjacent to a corner of each of the plurality if memory cell regions, wherein the pad regions are adjacent to each other.

Disposing the selected semiconductor chips on the package substrate can include: disposing a first chip, from the selected semiconductor chips, on the package substrate such that a pad region of the first chip is placed in the center region of the package substrate; and rotating a second chip, from the selected semiconductor chips, 180 degrees with respect to the first chip and disposing the second chip such that a pad region of the second chip is adjacent to the pad region of the first chip.

Forming each of the plurality of semiconductor chips can include: forming a plurality of memory cell regions in a line in each semiconductor chip; forming a peripheral region in each of row and column directions of each of the plurality of memory cell regions; and forming a pad region parallel to the row or column direction of each of the plurality of memory cell regions, wherein the pad regions are adjacent to each other.

Disposing the selected semiconductor chips on the package substrate can include: disposing a first chip, from the selected semiconductor chips, on the package substrate such that a pad region of the first chip is placed in the center region of the package substrate; and rotating a second chip, from the selected semiconductor chips, 180 degrees with respect to the first chip and disposing the second chip such that a pad region of the second chip is adjacent to the pad region of the first chip.

According to another aspect of the present invention, there is provided a method of manufacturing a semiconductor package. The method includes: forming a plurality of semiconductor chips having the same pattern direction on a semiconductor substrate, each of the semiconductor chips includes a memory cell region, a peripheral region, and a pad region, wherein the pad region is disposed in an edge region; separating the plurality of semiconductor chips from one another; and disposing selected semiconductor chips, from the separated semiconductor chips, on a package substrate, including changing the pattern directions of some of the selected semiconductor chips such that pad regions of each of the selected semiconductor chips are arranged in an edge region of the package substrate.

Forming the plurality of semiconductor chips can include: forming a memory cell region in a center region of each semiconductor chip; forming a peripheral region in each of row and column directions of the memory cell region; and forming a pad region adjacent to a corner of the memory cell region.

Disposing the selected semiconductor chips on the package substrate can include: disposing a first chip, from the selected semiconductor chips, on the package substrate such that a pad region of the first chip is placed in the edge region of the package substrate; and rotating a second chip, from the selected semiconductor chips, 90 degrees with respect to the first chip and disposing the second chip such that a pad region of the second chip is separated from the pad region of the first chip.

Disposing the selected semiconductor chips on the package substrate can further include rotating a third chip, from the selected semiconductor chips, 180 degrees with respect to the first chip and disposing the third chip such that a pad region of the third chip is separated from the pad region of the second chip.

Disposing the selected semiconductor chips on the package substrate can further include rotating a fourth chip, from the selected semiconductor chips, 270 degrees with respect to the first chip and disposing the fourth chip such that a pad region of the fourth chip is separated from the pad region of the third chip.

Forming the plurality of semiconductor chips can include: forming a memory cell region in the center region of each semiconductor chip; forming a peripheral region in each of row and column directions of the memory cell region; and forming a pad region parallel to the row or column direction of the memory cell region.

Disposing the selected semiconductor chips on the package substrate can include: arranging first and second chips, from the selected semiconductor chips, in a line on the package substrate such that pad regions of the first and second chips are placed in the edge region of the package substrate; and rotating third and fourth chips, from the selected semiconductor chips, 180 degrees with respect to the first chip and arranging the third and fourth chips such that pad regions of the third and fourth chips are separated from the pad regions of the first and second chips, respectively.

Forming the plurality of semiconductor chips can include: forming a plurality of memory cell regions in a line in each semiconductor chip; forming a peripheral region in each of row and column directions of each memory cell region; and forming a pad region adjacent to a corner of each memory cell region, wherein the pad regions are adjacent to each other.

Disposing the selected semiconductor chips on the package substrate can include: disposing a first chip, from the selected semiconductor chips, on the package substrate such that a pad region of the first chip is placed in the edge region of the package substrate; and rotating a second chip, from the selected semiconductor chips, 180 degrees with respect to the first chip and disposing the second chip such that a pad region of the second chip is separated from the pad region of the first chip.

Forming the plurality of semiconductor chips can include: forming a plurality of memory cell regions in a line in each semiconductor chip; forming a peripheral region in each of row and column directions of each memory cell region; and forming a pad region parallel to the row or column direction of each memory cell region, wherein the pad regions are adjacent to each other.

Disposing the selected semiconductor chips on the package substrate can include: disposing a first chip, from the selected semiconductor chips, on the package substrate such that a pad region of the first chip is placed in the edge region of the package substrate; and rotating a second chip, from the selected semiconductor chips, 180 degrees with respect to the first chip and disposing the second chip such that a pad region of the second chip is separated from the pad region of the first chip.

In accordance with another aspect of the present invention, there is provided a semiconductor package, comprising: a plurality of semiconductor chips having the same patterns, wherein each of the semiconductor chips comprises a memory cell region, a peripheral region, and a pad region, wherein the pad region is disposed in an edge region; and a package substrate on which the semiconductor chips are disposed so that some of the semiconductor chips have different pattern directions such that the pad regions of the semiconductor chips are arranged in a center region or edge region of the package substrate.

BRIEF DESCRIPTION OF THE DRAWINGS

The above and other aspects and features of the present invention will become more apparent by describing in detail exemplary embodiments thereof with reference to the attached drawings. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE PREFERRED EMBODIMENTS

Figure 1:
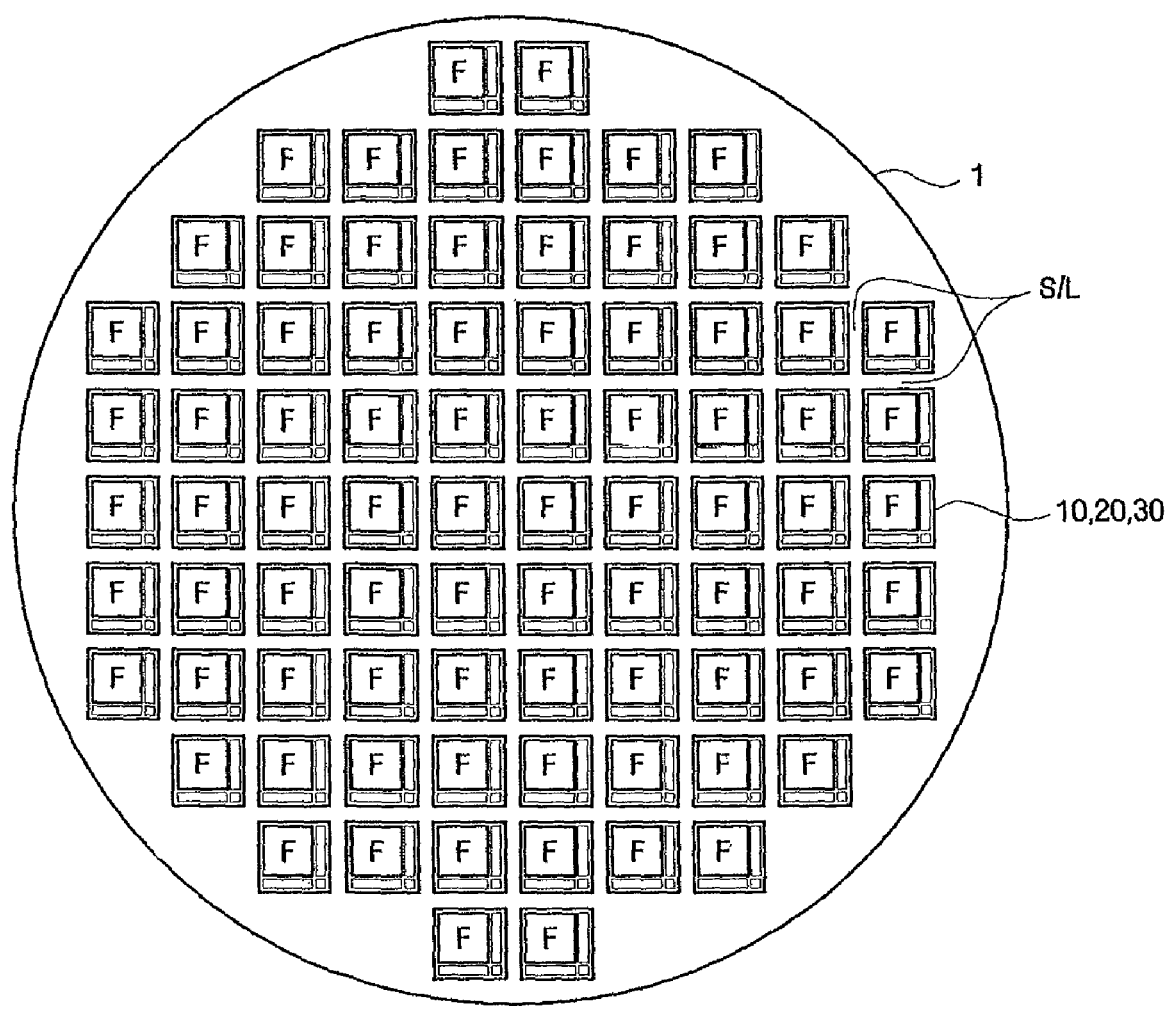
FIG. 1 is a plan view of an exemplary embodiment of a semiconductor substrate on which a plurality of semiconductor chips is formed according to an aspect of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. In the drawings, sizes and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. Like reference numerals in the drawings denote like elements, and thus their description will be omitted.

Exemplary embodiments described herein will be described referring to plan views and/or cross-sectional views by way of ideal schematic views. Accordingly, the exemplary views may be modified depending on manufacturing technologies and/or tolerances. Therefore, the invention is not limited to those exemplary embodiments shown in the views provided herein, but includes modifications in configuration formed on the basis of manufacturing processes. Therefore, regions exemplified in figures have schematic properties and shapes of regions shown in figures exemplify specific shapes of regions of elements and do not limit aspects of the invention.

Hereinafter, the exemplary embodiments in accordance with aspects of the present invention will be described in detail with reference to the attached drawings. A character "F" shown in the attached drawings is used to indicate a pattern direction of each semiconductor chip.

A semiconductor chip, a semiconductor package and a method of manufacturing the semiconductor package according to an exemplary embodiment in accordance with aspects of the present invention will now be described in detail with reference to FIGS. 1 through 6D.

FIG. 1 is a plan view of an exemplary embodiment of a semiconductor substrate 1 on which a plurality of semiconductor chips 10, 20, 30 are formed according to an aspect of the present invention. Semiconductor chips 10, 20 and 30 are from FIGS. 2A, 2B, and 2C, respectively. As will be understood, any of semiconductor chips 10, 20, and 30 can be used in the embodiment of FIG. 1. In this embodiment, one of semiconductor chips 10, 20, or 30 is formed on substrate 1.

Referring to FIG. 1, the semiconductor chips 10, 20 or 30 are repeatedly formed on a top surface of the semiconductor substrate 1, that is, a wafer. The semiconductor chips 10, 20 or 30 are formed in a fabrication process in which a predetermined pattern is repeatedly formed. The semiconductor chips 10, 20 or 30 are arranged in a matrix form on the top surface of the semiconductor substrate 1, in rows and columns. In addition, a scribe line S/L, which separates the semiconductor chips 10, 20 or 30 from one another, is defined in the semiconductor substrate 1.

Each of the semiconductor chips 10, 20 or 30 can perform an independent function in response to an input/output signal. Thus, each of the semiconductor chips 10, 20 or 30 includes a memory cell region, a peripheral region, and a pad region. In addition, the semiconductor chips 10, 20 or 30 have the same design structure and are formed in the same pattern on the semiconductor substrate 1. That is, when the semiconductor chips 10, 20 or 30 are formed, microelectronic devices can be formed by changing two-dimensional (2D) positions of masks (not shown) on the semiconductor substrate 1. Accordingly, the semiconductor chips 10, 20 or 30 have the same pattern direction, in the preferred embodiments.

The memory cell region of each of the semiconductor chips 10, 20 or 30 includes a plurality of memory cells which store data, that is, microelectronic devices such as a gate line (not shown), a bit line (not shown) and a capacitor (not shown), and occupies the largest area of each of the semiconductor chips 10, 20 or 30.

The peripheral region includes a plurality of logic circuits that are connected to the memory cells of the memory cell region and process signals from the memory cells. Generally, the peripheral region is disposed in each of the row and column directions of the memory cell region in order to control rows and columns of wiring lines arranged in the memory cells.

The pad region includes a plurality of input/output pads used to input or output control signals and a data signal from the memory cell region and the peripheral region. The pad region is disposed in an edge region of each of the semiconductor chips 10, 20 or 30 in order to facilitate electrical connection with external devices.

The size of the semiconductor chips 10, 20 or 30, which are separated from one another by the scribe line S/L, can vary according to memory capacity and chosen design rules. In addition, the arrangement of the memory cell region, the peripheral region, and the pad region in each of the semiconductor chips 10, 20 or 30 can vary according to how each of the semiconductor chips 10, 20 or 30 is to be used.

Thus, the structures and positions of the memory cell region, the peripheral region, and the pad region in each of the semiconductor chips 10, 20 or 30 can be changed in various ways. In order to implement a center-pad type semiconductor package, the pad region of each of the semiconductor chips 10, 20 or 30 can be disposed in the edge region thereof.

Example embodiments of the structures of each of the semiconductor chips 10, 20, and 30 will now be described in more detail with reference to FIGS. 2A through 2C.

Figure 2A:
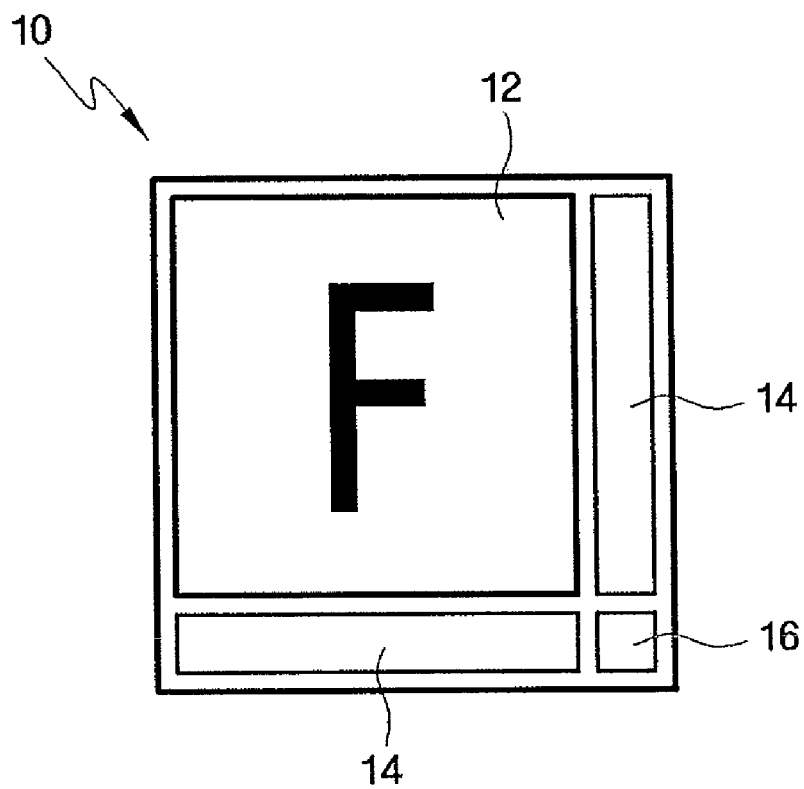
FIGS. 2A through 2C are plan views of exemplary embodiments of semiconductor chips according to aspects of the present invention.
Figure 2B:
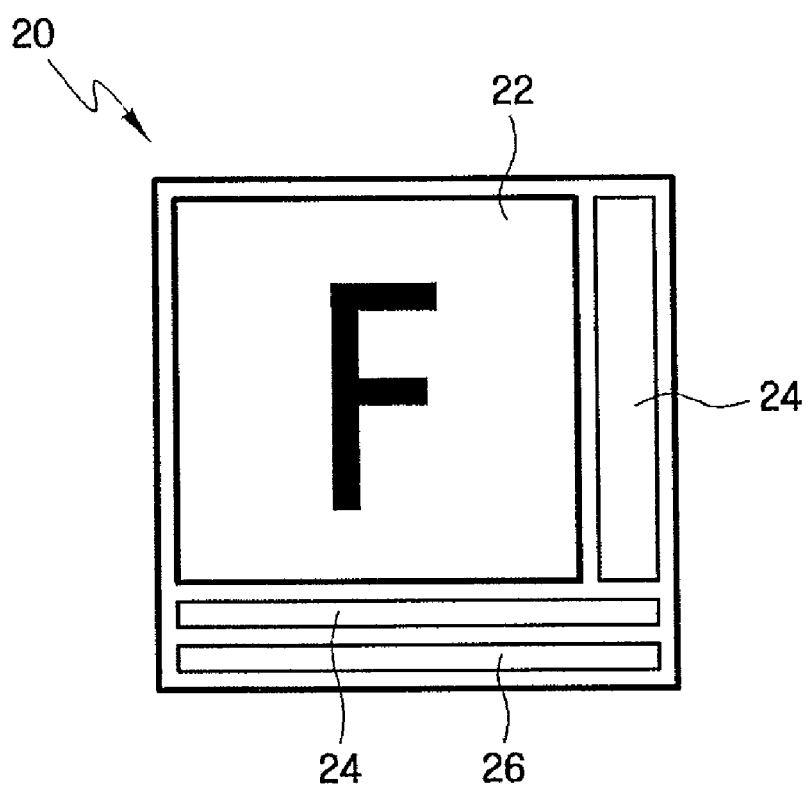
Figure 2C:
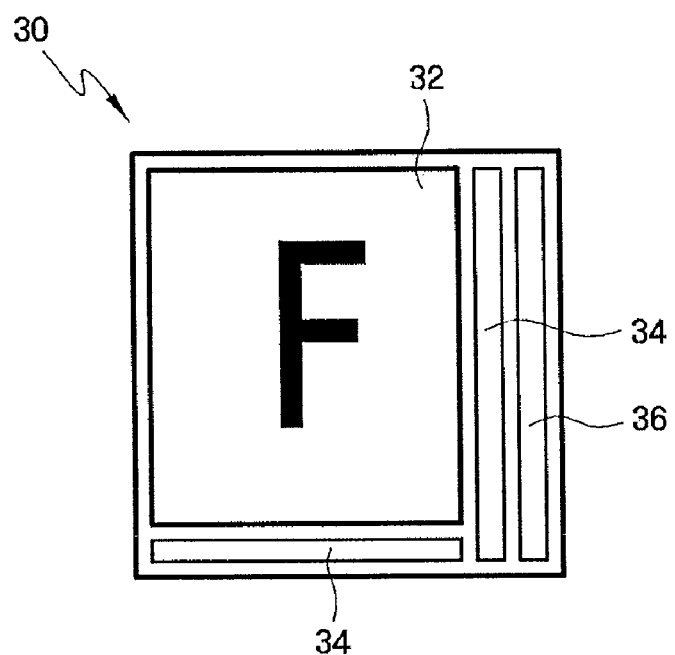

FIGS. 2A through 2C are plan views of example embodiments of semiconductor chips 10, 20, and 30 that can be formed on the semiconductor substrate 1 (see FIG. 1), according to aspects of the present invention.

Referring to FIG. 2A, the semiconductor chip 10 can be square or rectangular, as examples, and a memory cell region 12 is disposed in a center region of the semiconductor chip 10. In addition, a peripheral region 14 is disposed around the memory cell region 12. Specifically, the peripheral region 14 can be disposed in each of the row and column directions of the memory cell region 12. A pad region 16 can be disposed between the peripheral regions 14, that is, disposed adjacent to a corner of the memory cell region 12.

Referring to FIGS. 2B and 2C, a memory cell region 22 or 32 (depending on the embodiment) can be disposed in a center region of the semiconductor chip 20 or 30, and a peripheral region 24 or 34 can be disposed in each of the row and column directions of the memory cell region 22 or 32. In addition, a pad region 26 or 36 can be placed parallel to one of the peripheral regions 24 or 34. That is, the pad region 26 or 36 can be disposed in the row or column direction of the memory cell region 22 or 32.

As shown in FIGS. 2A through 2C, the pad region 16, 26 or 36 (depending on the embodiment) can be located in an edge region of, that is, around, the semiconductor chip 10, 20 or 30.

After the semiconductor chip 10, 20 or 30 of FIG. 2A, 2B or 2C is repeatedly formed on the semiconductor substrate 1, it is tested. For example, an electrical die sorting (EDS) process can be performed to inspect the electrical properties of the semiconductor chips 10, 20 or 30 formed on the semiconductor substrate 1. In the EDS process, defective cells are detected from the semiconductor chips 10, 20 or 30 formed on the semiconductor substrate 1. Accordingly, the semiconductor chips 10, 20 or 30 formed on the semiconductor substrate 1 can be divided into defective and non-defective semiconductor chips.

Figure 3:
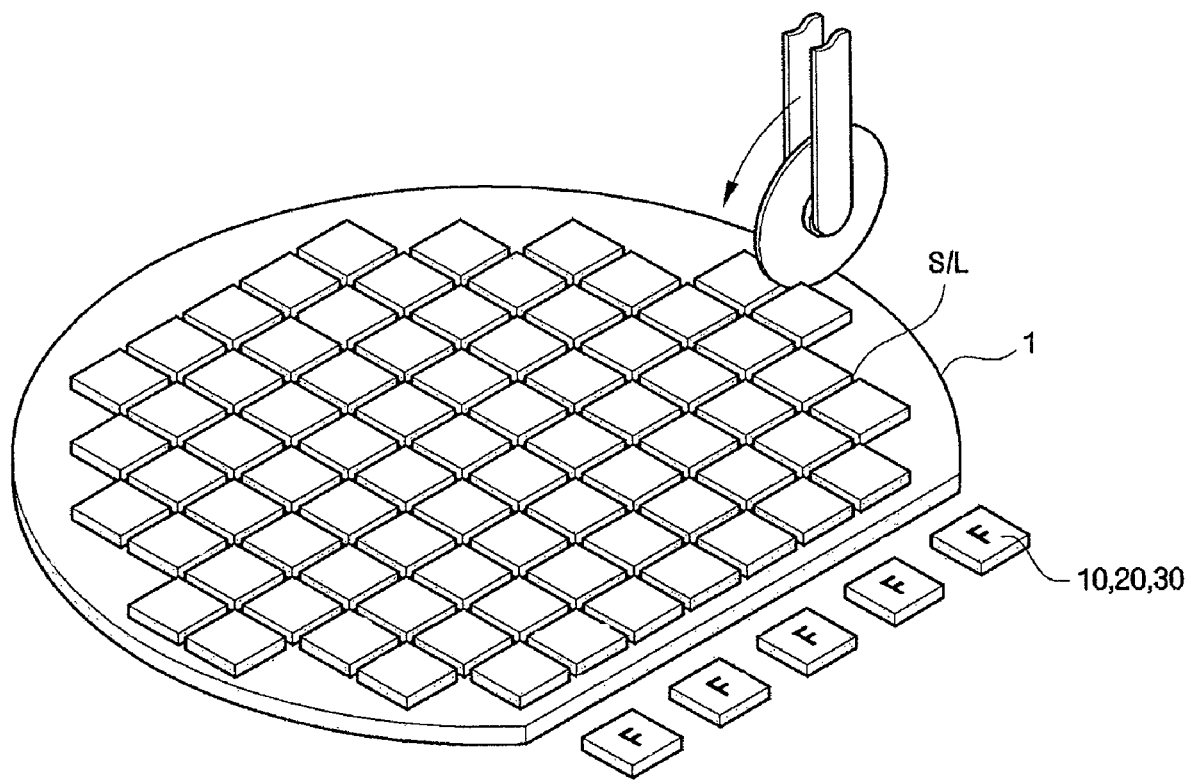
FIG. 3 shows exemplary embodiments of a process of separating semiconductor chips from one another according to an aspect of the present invention.

After the semiconductor chips 10, 20 or 30 are sorted, they can be separated from one another as shown in FIG. 3. FIG. 3 shows an exemplary embodiment of a process of separating semiconductor chips 10, 20 or 30 from one another according to aspects of the present invention.

Referring to FIG. 3, the semiconductor chips 10, 20 or 30, which are formed on a semiconductor substrate 1, are separated from one another along a scribe line S/L using a dicing apparatus. Then, only non-defective ones of the separated semiconductor chips 10, 20 or 30 are used to manufacture a semiconductor package.

Before the semiconductor chips 10, 20 or 30 are separated from one another, the thickness of the semiconductor substrate 1 can be reduced in order to produce a thinner semiconductor package. That is, a rear surface of the semiconductor substrate 1 having the semiconductor chips 10, 20, or 30 can be lapped, for example.

Next, the separated semiconductor chips 10, 20 or 30 are packaged to manufacture a semiconductor package.

In order to manufacture a large-capacity semiconductor package, large-capacity semiconductor chips can be formed on a semiconductor substrate. In this case, the size of each semiconductor chip can be increased while the number of semiconductor chips that can be obtained from a sheet of semiconductor substrate is reduced. Consequently, the yield of the semiconductor chips can be reduced.

In order to address this problem, a plurality of low-capacity semiconductor chips can be integrated into a large-capacity semiconductor package. In this case, since the low-capacity semiconductor chips are small-sized, the number of semiconductor chips that can be obtained from a sheet of semiconductor substrate is increased, thereby enhancing the yield.

When the low-capacity semiconductor chips are assembled into a single semiconductor package, the position of respective pad regions of the semiconductor chips in the semiconductor package is important to prevent electrical short circuits between the semiconductor chips.

If the position of the pad regions of the semiconductor chips in the semiconductor package is fixed, it is difficult to actively respond to various customer needs. Therefore, it is required to flexibly change the position of the pad regions of the semiconductor chips, so that the semiconductor chips can be applied to various package types.

In this regard, when the semiconductor chips are packaged, pads used for electrical connection with external devices can be arranged in a center or edge region of the semiconductor package.

In an exemplary embodiment, a case where respective pad regions of semiconductor chips are arranged in a center region of each semiconductor package in order to facilitate the stacking of a plurality of semiconductor packages will be described, as an example.

A center-pad type semiconductor package, in which respective pad regions of a plurality of semiconductor chips are arranged in a center region of a package substrate when the semiconductor chips are packaged, and an embodiment of a method of manufacturing the semiconductor package will now be described in detail with reference to FIGS. 4A through 4C and 5.

Figure 4A:
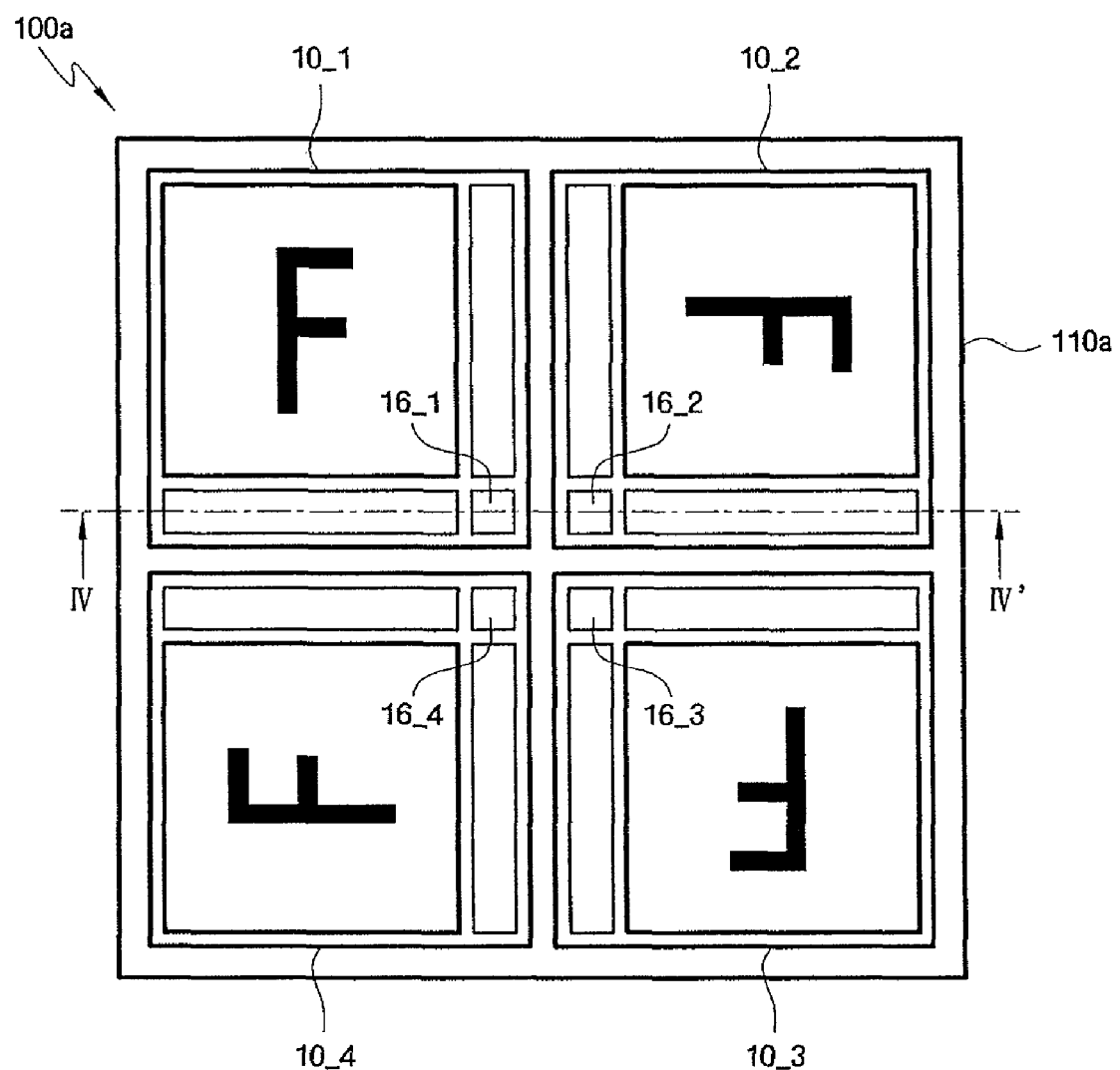
FIGS. 4A through 4C are plan views of exemplary embodiments of center-pad type semiconductor packages according to aspects of the present invention.
Figure 4B:
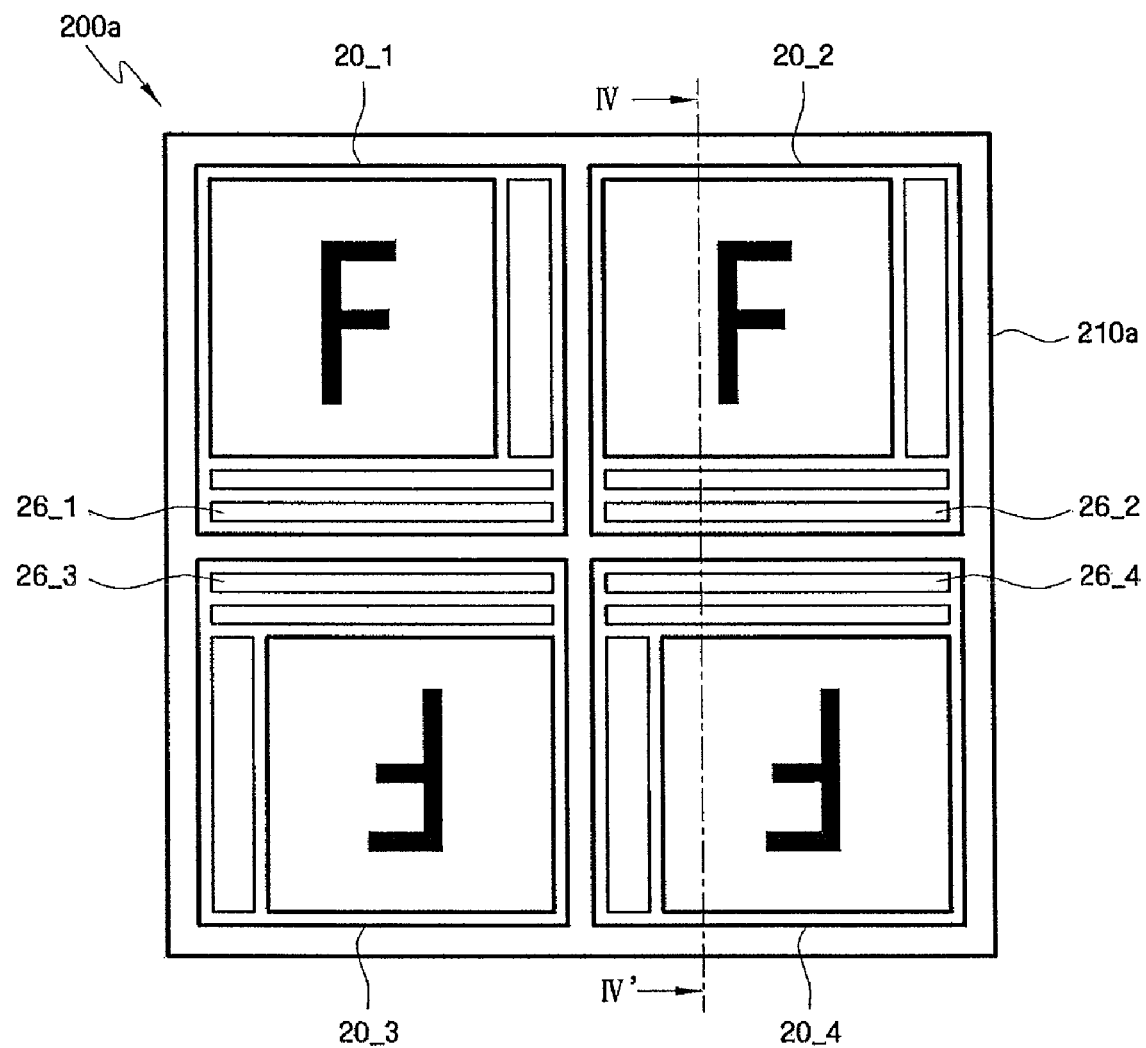
Figure 4C:
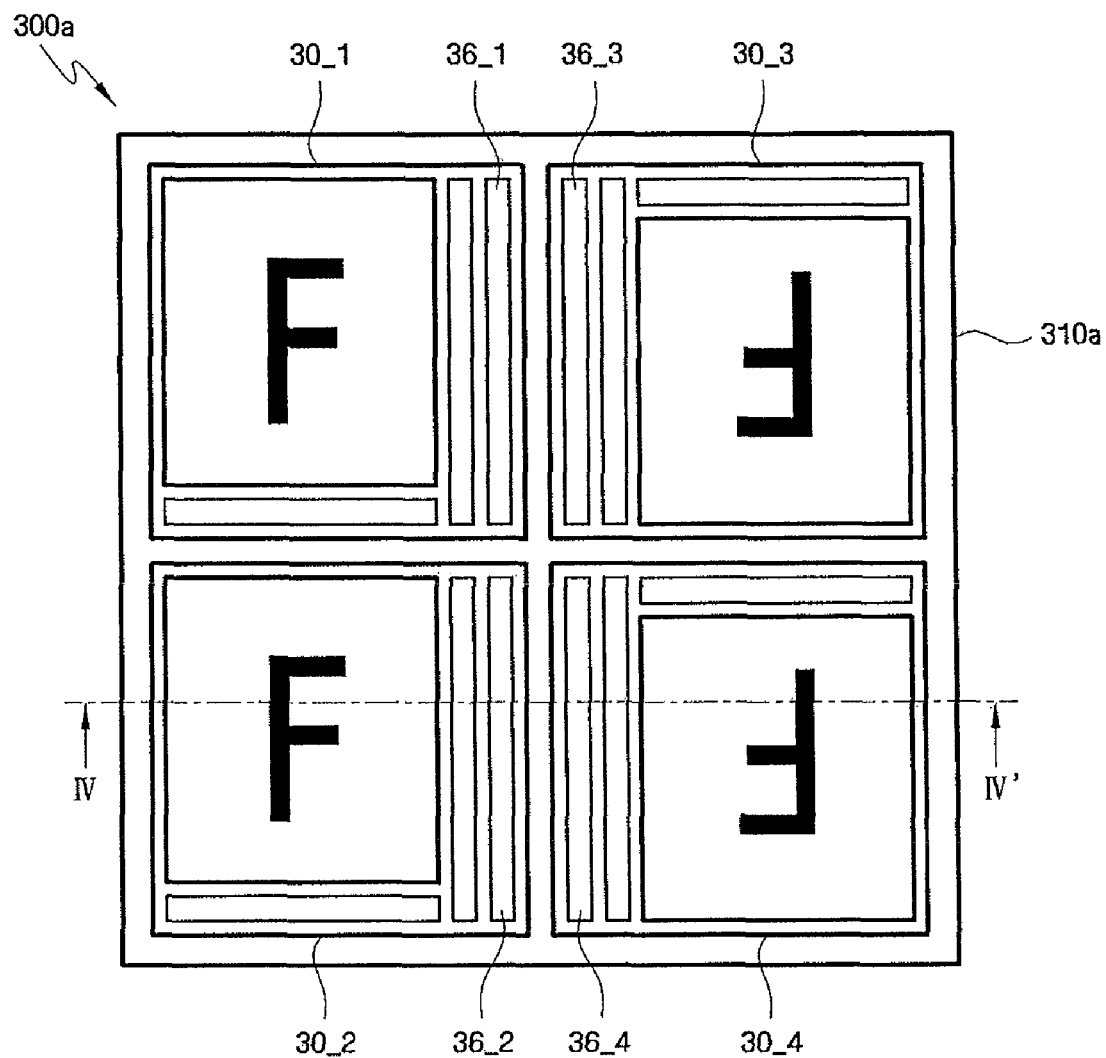

FIGS. 4A through 4C are plan views of exemplary embodiments of center-pad type semiconductor packages 100a, 200a, and 300a according to aspects of the present invention.

When a plurality of semiconductor chips are bonded onto a package substrate, the number of semiconductor chips that can be bonded onto the package substrate can be determined by the desired capacity of the semiconductor package. In addition, the capacity of each semiconductor chip can dictate the number of semiconductor chips that can be bonded onto the package substrate.

For example, 128 megabyte (M), 256 M byte, or 512 M byte semiconductor chips can be packaged to manufacture a 1-giga byte (G) semiconductor package.

In the exemplary embodiments, a case where 256 M byte semiconductor chips are packaged to manufacture a 1 G byte semiconductor package will be described.

Referring to FIG. 4A, from among a plurality of semiconductor chips (indicated by reference numeral 10 in FIG. 2A) which are formed on a semiconductor substrate (indicated by reference numeral 1 in FIG. 1) and in each of which a pad region is located at a corner, a first chip 10_1 is bonded to a specified region of a package substrate 110a. Here, a pad region 16_1 of the first chip 10_1 must be placed in a center region of the package substrate 110a.

From among the semiconductor chips (indicated by reference numeral 10 in FIG. 2A), which are formed on the semiconductor substrate (indicated by reference numeral 1 in FIG. 1) and then separated from one another, a second chip 10_2 is rotated 90 degrees with respect to the first chip 10_1 and placed at one a side of the first chip 10_1. That is, the second chip 10_2 is placed on a side of the pad region 16_1 of the first chip 10_1. Here, the first chip 10_1 and the second chip 10_2 can be separated from each other with a predetermined gap therebetween. Accordingly, the pad regions 16_1 and 16_2 of the first chip 10_1 and the second chip 10_2, respectively, are arranged adjacent to each other in the center region of the package substrate 110a.

Next, from among the semiconductor chips (indicated by reference numeral 10 in FIG. 2A) which are formed on the semiconductor substrate (indicated by reference numeral 1 in FIG. 1) and then separated from one another, a third chip 10_3 is rotated 180 degrees with respect to the first chip 10_1 and placed on a side of the pad region 16_2 of the second chip 10_2. Accordingly, the pad regions 16_2 and 16_3 of the second chip 10_2 and the third chip 10_3, respectively, are arranged adjacent to each other in the center region of the package substrate 110a.

Next, from among the semiconductor chips (indicated by reference numeral 10 in FIG. 2A) which are formed on the semiconductor substrate (indicated by reference numeral 1 in FIG. 1) and then separated from one another, a fourth chip 10_4 is rotated 270 degrees with respect to the first chip 10_1 and placed adjacent to the pad regions 16_1 and 16_3 of the first and third chips 10_1 and 10_3, respectively. Accordingly, the pad region 16_4 of the fourth chip is arranged to be adjacent to pad regions 16_1 and 16_3 of the first chip 10_1 and the third chip 10_3. And as a result, pad regions 16_1, 16_2, 16_3, and 16_4 are all arranged in the center region of the package substrate 110a.

As described above, if the semiconductor chips (indicated by reference numeral 10 in FIG. 2A), which are formed on the semiconductor substrate (indicated by reference numeral 1 in FIG. 1) and then separated from one another, are bonded onto the package substrate 110a after they are rotated, the respective pad regions of the semiconductor chips can be concentrated in the center region of the package substrate 110a. That is, the center-pad type semiconductor package 100a can be obtained without using semiconductor chips whose respective pad regions are disposed in the center thereof.

Referring to FIG. 4B, from among a plurality of semiconductor chips (indicated by reference numeral 20 in FIG. 2B) which are formed on a semiconductor substrate (indicated by reference numeral 1 in FIG. 1) and arranged in the same direction, a first chip 20_1 is bonded to a specified region of a package substrate 210a. Here, a pad region 26_1 of the first chip 20_1 must be placed in a center region of the package substrate 210a.

From among the semiconductor chips (indicated by reference numeral 20 in FIG. 2B) which are formed on the semiconductor substrate (indicated by reference numeral 1 in FIG. 1) and then separated from one another, a second chip 20_2 is placed on a side of the first chip 20_1. Here, the second chip 20_2 is disposed in the same direction as the first chip 20_1, and a pad region 26_2 of the second chip 20_2 is placed in the center region of the package substrate 210a. Thus, the pad regions 26_1 and 26_2 of the first and second chips 20_1 and 20_2 can extend across the center region of the package substrate 210a.

Next, from among the semiconductor chips (indicated by reference numeral 20 in FIG. 2B), which are formed on the semiconductor substrate (indicated by reference numeral 1 in FIG. 1) and then separated from one another, a third chip 20_3 and a fourth chip 20_4 are rotated 180 degrees with respect to the first chip 20_1 such that pad regions 26_3 and 26_4 of the third and fourth chips 20_3 and 20_4 extend across the center region of the package substrate 210a. Consequently, the pad regions 26_1 and 26_2 of the first and second chips 20_1 and 20_2 are symmetrical to the pad regions 26_3 and 26_4 of the third and fourth chips 20_3 and 20_4, respectively.

As described above, since the pad regions 26_1 through 26_4 of the first through fourth chips 20_1 through 20_4 are arranged parallel to row directions of memory cell regions, respectively, they extend across a center region of the package substrate 210a in a row direction of the package substrate 210a.

Referring to FIG. 4C, from among a plurality of semiconductor chips (indicated by reference numeral 30 in FIG. 2C), which are formed on a semiconductor substrate (indicated by reference numeral 1 in FIG. 1) and arranged in the same direction, a first chip 30_1 and a second chip 30_2 are bonded onto a package substrate 310a such that respective pad regions 36_1 and 36_2 of the first and second chips 30_1 an 30_2 are arranged in a line. That is, the first and second chips 30_1 and 30_2 can be bonded onto the package substrate 310a in the same direction as the direction in which they were arranged on the semiconductor substrate (indicated by reference numeral 1 in FIG. 1).

Then, third and fourth chips 30_3 and 30_4 are placed on sides of the first and second chips 30_1 and 30_2, respectively, such that respective pad regions 36_3 and 36_4 of the third and fourth chips 30_3 and 30_4 are arranged in a line. That is, the third and fourth chips 30_3 and 30_4 are rotated 180 degrees with respect to the first chip 30_1 and arranged accordingly.

As described above, since the pad regions 36_1 through 36_4 of the first through fourth chips 30_1 through 30_4 are arranged parallel to column directions of memory cell regions, respectively, they extend across a center region of the package substrate 310a in a column direction of the package substrate 310a.

A cross-sectional structure of the center-pad type semiconductor package 100a, 200a or 300a shown in FIG. 4A, 4B or 4C will now be described in detail with reference to FIG. 5.

Figure 5:
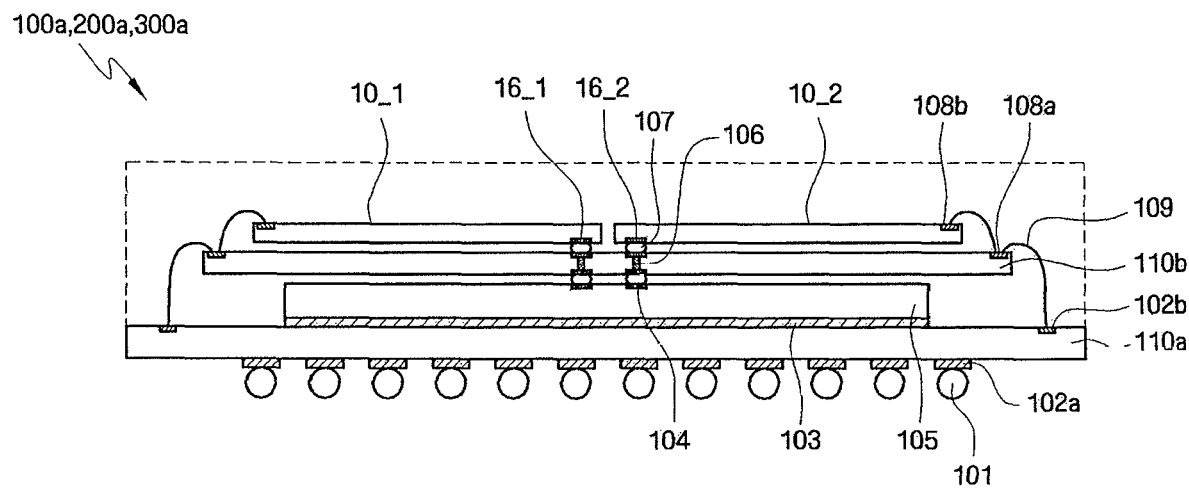
FIG. 5 is a cross-sectional view of the semiconductor package shown in FIG. 4A, 4B, or 4C.

FIG. 5 is a cross-sectional view of the semiconductor package 100a, 200a or 300a shown in FIG. 4A, 4B or 4C, respectively. That is, each of semiconductor packages 100a, 200a, and 300a have the same cross-sectional view when taken along a line IV-IV' of FIGS. 4A, 4B and 4C, respectively, as in FIG. 5.

In the semiconductor package 100a, 200a or 300a of FIG. 5, a plurality of semiconductor chips are not only arranged on a flat surface, but are also stacked vertically. Thus, the package substrate 110a, 210a, or 310a shown in FIG. 4A, 4B or 4C can correspond to a package substrate 110a or an interposer 110b shown in FIG. 5. That is, a plurality of semiconductor chips 10_1 and 10_2 can be bonded onto a top surface of the package substrate 110a or the interposer 110b.

Specifically, referring to FIG. 5, a semiconductor device 105 is bonded onto the package substrate 110a using an adhesive 103. The semiconductor device 105 can be a memory chip or a central processing unit (CPU), as examples. While one semiconductor device 105 is bonded onto the package substrate 110a in FIG. 5, a plurality of semiconductor devices can be bonded onto the top surface of the package substrate 110a.

Wiring is formed on a surface of the package substrate 110a, and substrate pads 102a and 102b, which provide external electrical connections to the semiconductor package 100a, 200a, or 300a, are formed on bottom and top surfaces of the package substrate 110a. In addition, solder balls 101 are attached to the substrate pads 102a formed on the bottom surface of the package substrate 110a and are used as external connection terminals.

Input/output pads 104 are formed on a top surface of the semiconductor device 105, which is attached to the top surface of the package substrate 110a. The input/output pads 104 can be electrically connected to other semiconductor chips and substrates. In addition, the semiconductor device 105 can be a center-pad type semiconductor device that has input/output pads arranged in a center region thereof.

The interposer 110b, on which the semiconductor chips 10_1 and 10_2 can be stacked, is disposed on the semiconductor device 105.

The interposer 110b reduces wiring layers when pads, which provide signals, power supply, and ground connections to a semiconductor chip, are integrated. In addition, the interposer 110b reduces the length of a wire when each semiconductor chip is wire-bonded. Specifically, the interposer 110b can include penetrating electrodes 106. Thus, the input/output pads 104 of the semiconductor chips 10_1 and 10_2 and the semiconductor device 105, disposed on and under the interposer 110b, can be directly joined to the penetrating electrodes 106. As a result, the penetrating electrodes 106 provide electrical connection paths between the semiconductor chips 10_1 and 10_2 and the semiconductor device 105. In addition, connection pads, which provide electrical connection paths, can be formed on a surface of the interposer 110b.

The interposer 110b disposed on the semiconductor device 105 can be mechanically and electrically connected to the semiconductor device 105 by solder bumps 107. The interposer 110b can include the penetrating electrodes 106 in the center thereof to be electrically connected to the center-pad type semiconductor device 105.

The semiconductor chips 10_1 and 10_2 are arranged on a top surface of the interposer 110b according to the locations of the solder bumps 107. That is, the semiconductor chips 10_1 and 10_2 are arranged on the top surface of the interposer 11b as shown in FIG. 4A, 4B or 4C, depending on where the solder bumps 107 are physically located.

Accordingly, respective pad regions 16_1 and 16_2 of the semiconductor chips 10_1 and 10_2 are arranged in a center region of the interposer 110b and connected to the penetrating electrodes 106, respectively.

In addition, bonding pads 108b can be formed on top surfaces of the semiconductor chips 10_1 and 10_2 and the semiconductor chips 10_1 and 10_2 can be wire-bonded and, thus, electrically connected to the interposer 110b and the package substrate 110a.

The semiconductor package 100a, 200a or 300a described above is sealed with a molding material, such as epoxy, to enclose the semiconductor device 105, the interposer 110b, the semiconductor chips 10_1 and 10_2, bonding wires and junctions therein. Enclosing the semiconductor package can be done using materials and techniques known in the art.

Hereinafter, embodiments of an edge-pad type semiconductor package, in which respective pad regions of a plurality of semiconductor chips are arranged in an edge region of a package substrate when the semiconductor chips are packaged, and a method of manufacturing the same according to aspects of the present invention will be described in detail with reference to FIGS. 6A through 6D.

FIGS. 6A through 6D are plan views of exemplary embodiments of an edge-pad type semiconductor packages 100b, 100b', 200b and 300b according to another aspect of the present invention.

Figure 6A:
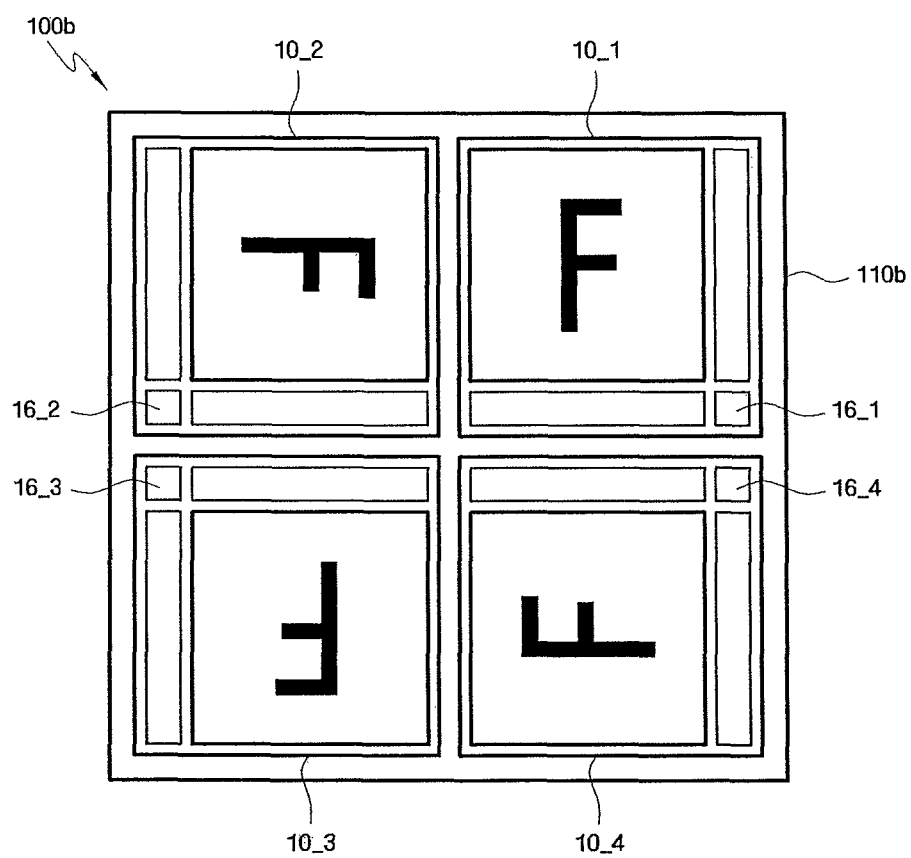
FIGS. 6A through 6D are plan views of exemplary embodiments of edge-pad type semiconductor packages according to other aspects of the present invention.
Figure 6B:
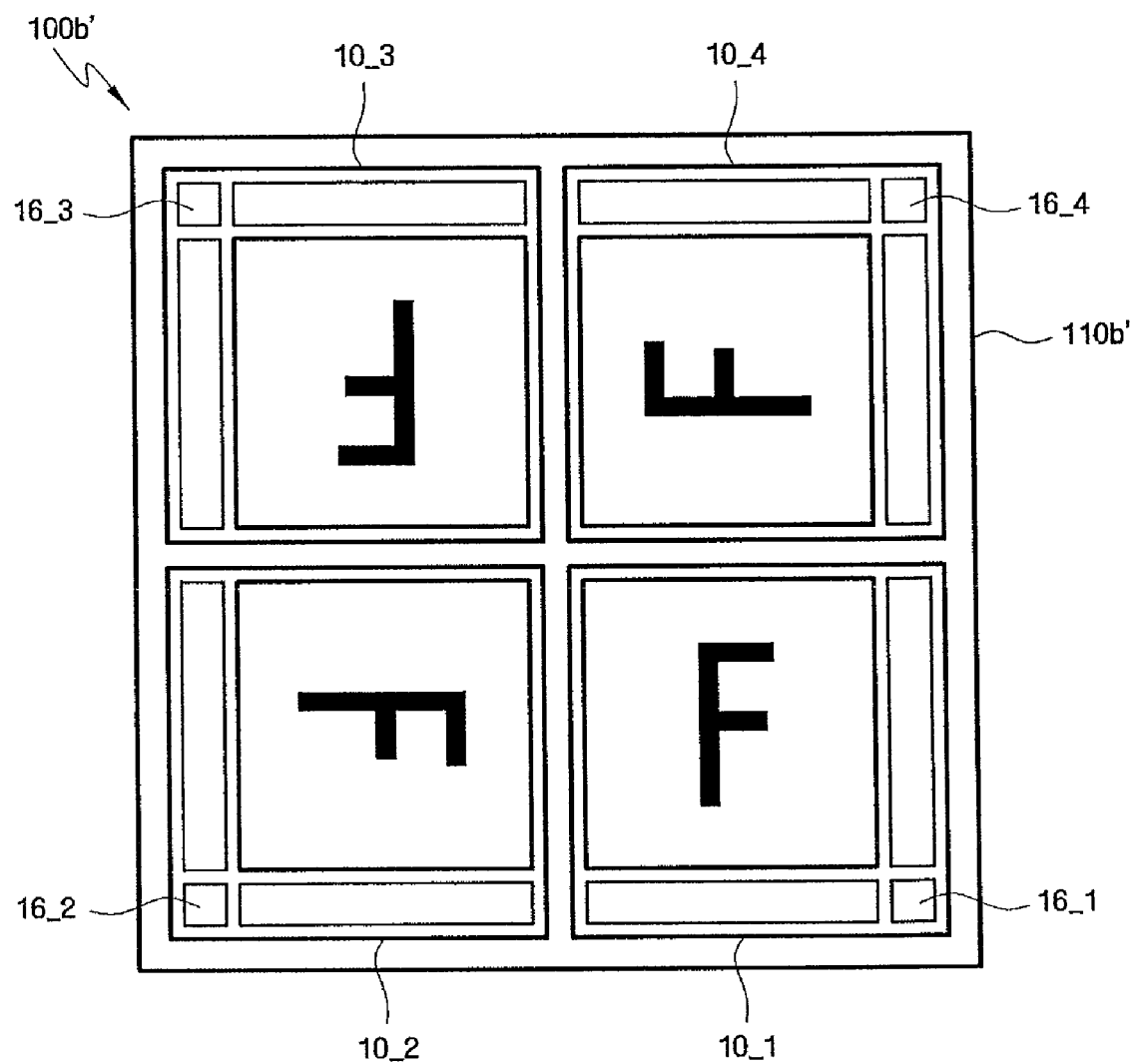

Referring to FIGS. 6A and 6B, from among a plurality of semiconductor chips (indicated by reference numeral 10 in FIG. 2A) in each of which a pad region is located at a corner, a first chip 10_1 is bonded to a specified region of a package substrate 110b or 110b'. Here, a pad region 16_1 of the first chip 10_1 must be placed in an edge region of the package substrate 110b or 110b'.

Then, a second chip 10_2 is rotated 90 degrees with respect to the first chip 10_1, which is disposed on the package substrate 110b or 110b', and placed on a side of the first chip 10_1. Here, a pad region 16_2 of the second chip 10_2 may be adjacent to or separated from the pad region 16_1 of the first chip 10_1 in the edge region of the package substrate 110b or 110b'.

From among the semiconductor chips (indicated by reference numeral 10 in FIG. 2A), which are formed on a semiconductor substrate (indicated by reference numeral 1 in FIG. 1) and then separated from one another, a third chip 10_3 is rotated 180 degrees with respect to the first chip 10_1 and placed on a side of the second chip 10_2. Here, a pad region 16_3 of the third chip 10_3 may be adjacent to or separated from the pad region 16_2 of the second chip 10_2 in the edge region of the package substrate 110b or 110b'.

Next, from among the semiconductor chips (indicated by reference numeral 10 in FIG. 2A), which are formed on the semiconductor substrate (indicated by reference numeral 1 in FIG. 1) and then separated from one another, a fourth chip 10_4 is rotated 270 degrees with respect to the first chip 10_1 and placed on a side of each of the first and third chips 10_1 and 10_3. Here, a pad region 16_4 of the fourth chip 10_4 may be adjacent to or separated from the pad region 16_1 of the first chip 10_1 in the edge region of the package substrate 110b or 110b'.

As described above, if the semiconductor chips (indicated by reference numeral 10 in FIG. 2A), which are formed on the semiconductor substrate (indicated by reference numeral 1 in FIG. 1) and then separated from one another, are bonded onto the package substrate 110b or 110b' after their pattern directions are changed, the respective pad regions of the semiconductor chips may be arranged in the edge region of the package substrate 110b or 110b'.

Figure 6C:
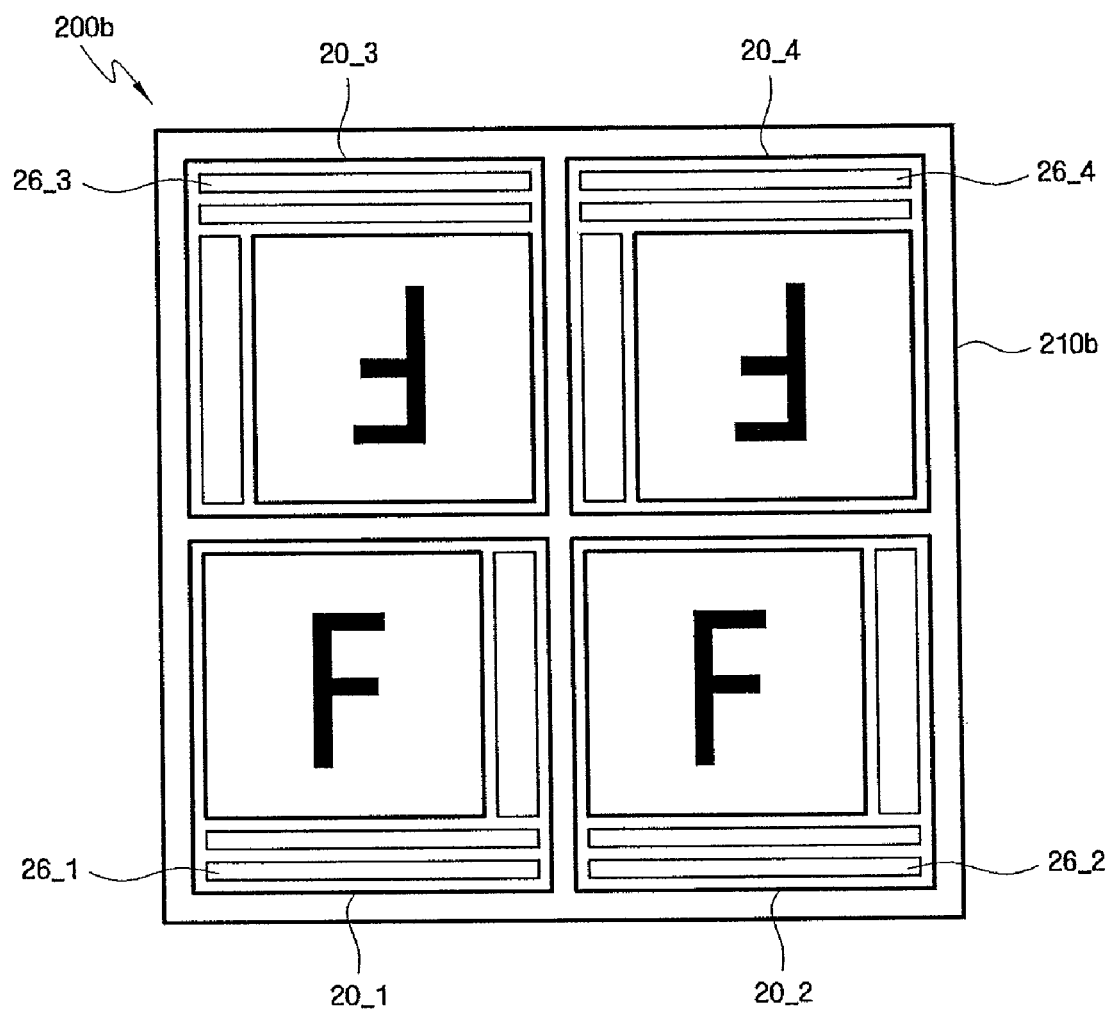
Figure 6D:
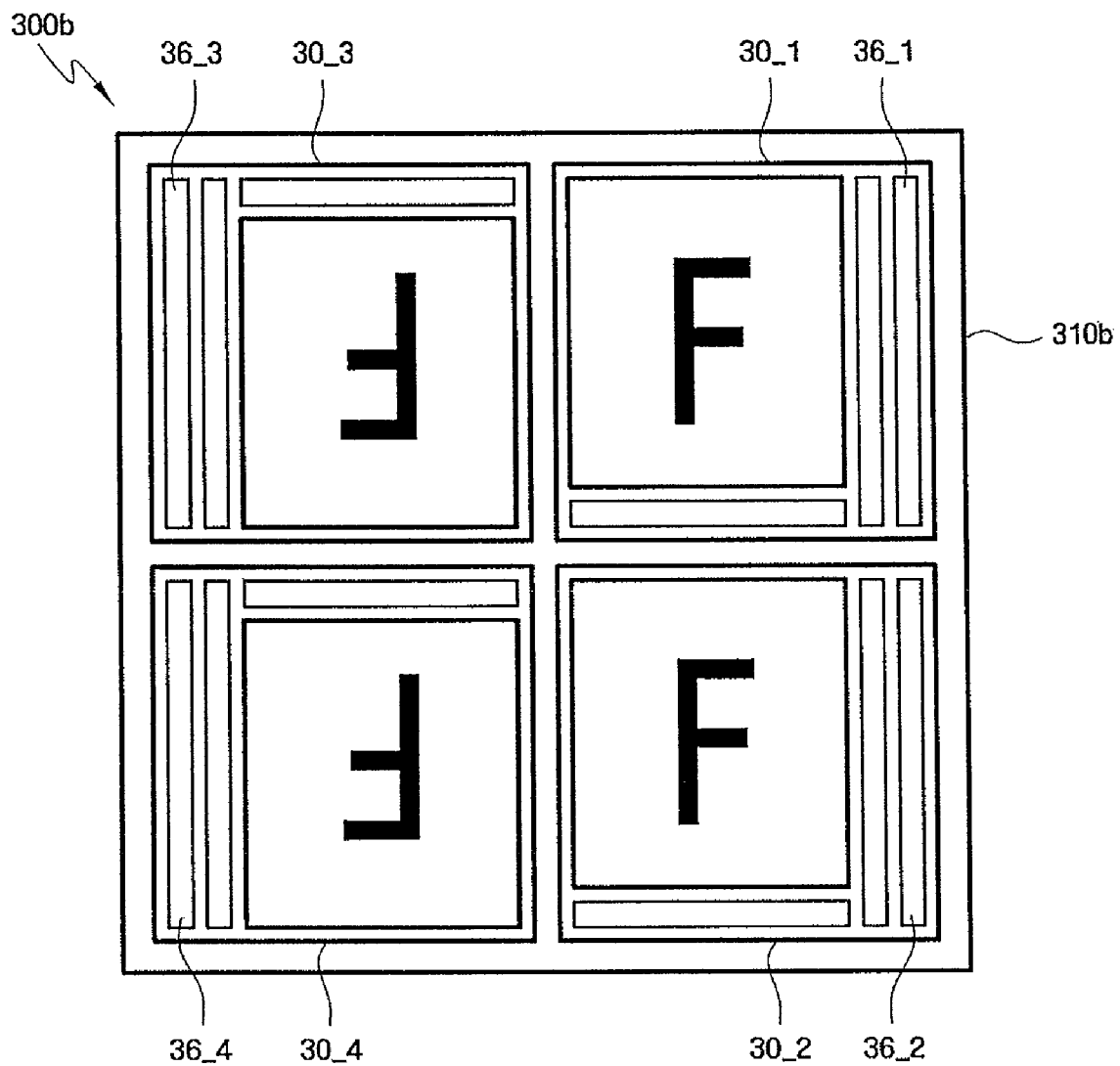

Referring to FIGS. 6C and 6D, from among a plurality of semiconductor chips (indicated by reference numeral 20 in FIG. 2B) in each of which a pad region is disposed parallel to a row or column direction of a memory cell region, a first chip 20_1 or 30_1 (depending on the embodiment) is bonded onto a specified region of a package substrate 210b or 310b. Here, a pad region 26_1 or 36_1 of the first chip 20_1 or 30_1 may be placed in an edge region of the package substrate 210 or 310b.

From among the semiconductor chips (indicated by reference numeral 20 in FIG. 2B), which are formed on a semiconductor substrate (indicated by reference numeral 1 in FIG. 1) and then separated from one another, a second chip 20_2 or 30_2 is placed on a side of the first chip 20_1 or 30_1. Here, the pattern direction of the second chip 20_2 or 30_2 is identical to that of the first chip 20_1 or 30_1, and a pad region 26_2 or 36_2 of the second chip 20_2 or 30_2 is placed in the edge region of the package substrate 210*b* or 310*b*. Thus, the pad regions 26_1 or 36_1 and 26_2 or 36_2 of the first and second chips 20_1 or 30_1 and 20_2 or 30_2 may be arranged in a line in the edge region of the package substrate 210*b* or 310*b*.

Next, from among the semiconductor chips (indicated by reference numeral 20 in FIG. 2B), which are formed on the semiconductor substrate (indicated by reference numeral 1 in FIG. 1) and then separated from one another, a third chip 20_3 or 30_3 and a fourth chip 20_4 or 30_4 are rotated 180 degrees with respect to the first chip 20_1 or 30_1 and placed in the edge region of the package substrate 210*b* or 310*b*. Here, pad regions 26_3 or 36_3 and 26_4 or 36_4 of the third and fourth chips 20_3 or 30_3 and 20_4 or 30_4 may be separated from and symmetrical to the pad regions 26_1 or 36_1 and 26_2 or 36_2 of the first and second chips 20_1 or 30_1 and 20_2 or 30_2 in the edge region of the package substrate 210*b* or 310*b*.

A semiconductor device, a semiconductor package and an exemplary embodiment of a method of manufacturing the semiconductor package according to another aspect of the present invention will now be described in detail with reference to FIGS. 7 through 11D.

Figure 7:
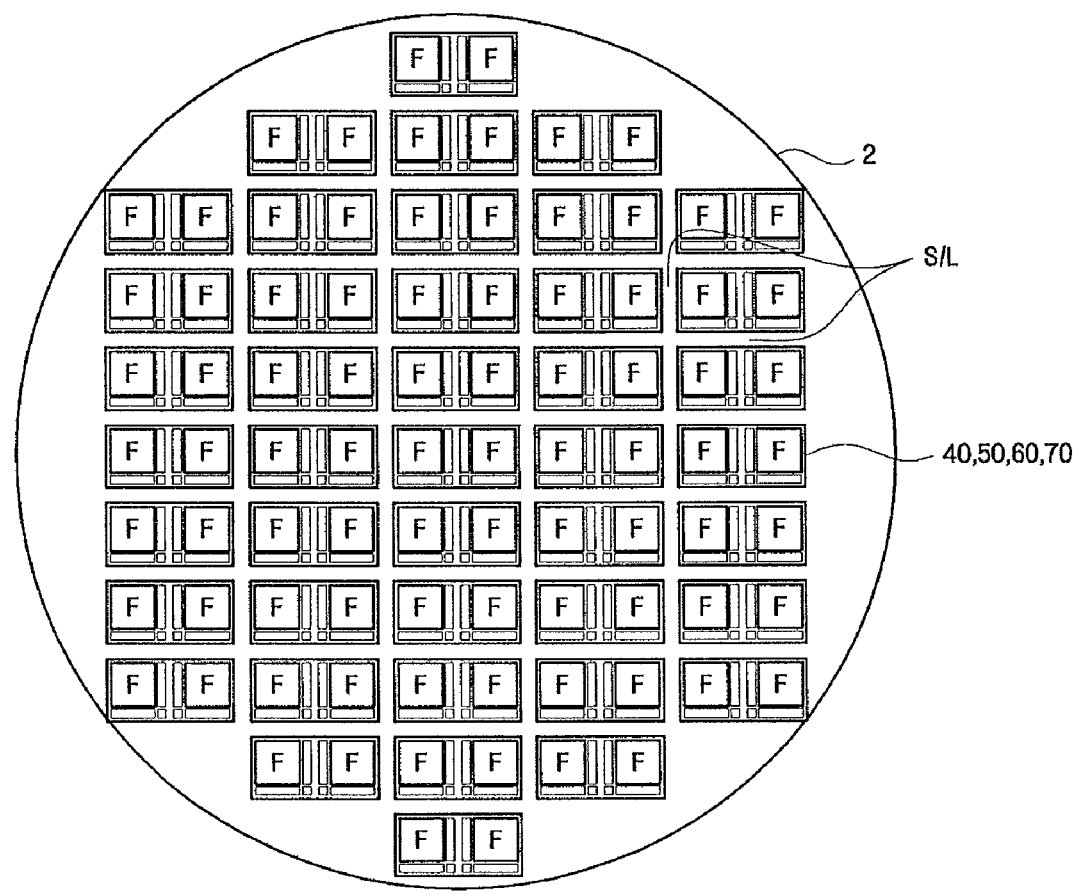
FIG. 7 is a plan view of an exemplary embodiment of a semiconductor substrate on which a plurality of semiconductor chips is formed according to another aspect of the present invention.

FIG. 7 is a plan view of an exemplary embodiment of a semiconductor substrate 2 on which a plurality of semiconductor chips 40, 50, 60 or 70 (from FIGS. 8A through 8D, respectively) are formed according to another aspect of the present invention.

Referring to FIG. 7, the semiconductor chips 40, 50, 60 or 70 (depending on the embodiment) are repeatedly formed on a top surface of the semiconductor substrate 2. That is, the semiconductor chips 40, 50, 60 or 70 are arranged in the same design structure on the semiconductor substrate 2. In addition, a scribe line S/L, which separates the semiconductor chips 40, 50, 60 or 70 from one another, is defined in the semiconductor substrate 2.

Each of the semiconductor chips 40, 50, 60 or 70 can include a plurality of memory cell regions, a plurality of peripheral regions, and a plurality of pad regions, as discussed above. For example, two memory cell regions may be formed in each of the semiconductor chips 40, 50, 60 or 70, and two peripheral regions may be formed to correspond to the two memory cell regions, respectively. In addition, two pad regions, which are used to input or output signals to/from the two memory cell regions, may be formed to correspond to the two memory cell regions, respectively.

Each of the semiconductor chips 40, 50, 60 or 70 can perform an independent function. The pad regions corresponding to the memory cell regions are arranged adjacent to one another in each of the semiconductor chips 40, 50, 60 or 70. That is, the pad regions can be arranged in a center region or an edge region of each of the semiconductor chips 40, 50, 60 or 70.

The design structure of each of the semiconductor chips 40, 50, 60, and 70 will now be described in more detail with reference to FIGS. 8A through 8D, respectively.

FIGS. 8A through 8D are plan views of exemplary embodiments of semiconductor chips 40, 50, 60, and 70 on a semiconductor substrate 2 (see FIG. 7) according to other aspects of the present invention.

Figure 8A:
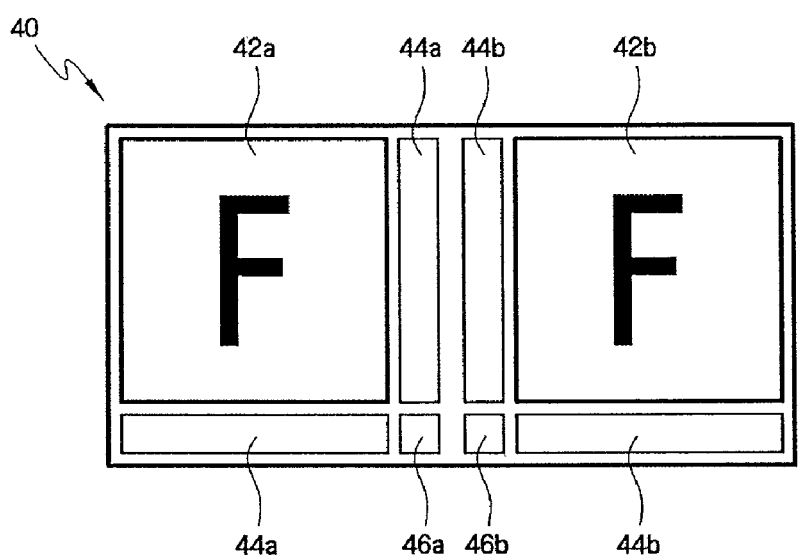
FIGS. 8A through 8D are plan views of exemplary embodiments of semiconductor chips according to other aspects of the present invention.
Figure 8B:
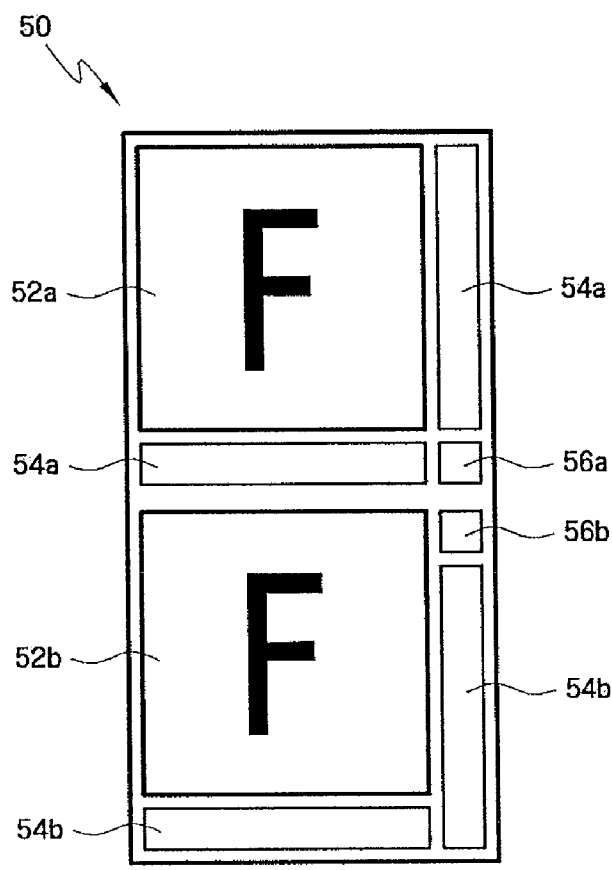

Referring to FIGS. 8A and 8B, the semiconductor chips 40 and 50 (depending on the embodiment) can be rectangular or square, as examples, and two memory cell regions 42*a* and 42*b* or 52*a* and 52*b* can be disposed in each of the semiconductor chips 40 and 50.

The memory cell regions 42*a* and 42*b* or 52*a* and 52*b* can be disposed on both sides of a center region of the semiconductor chip 40 or 50. In addition, the memory cell regions 42*a* and 42*b* or 52*a* and 52*b* can be arranged in a row or column direction of the semiconductor chip 40 or 50. The two memory cell regions 42*a* and 42*b* or 52*a* and 52*b* have the same pattern direction and are connected to peripheral regions 44*a* and 44*b* or 54*a* and 54*b* and pad regions 46*a* and 46*b* or 56*a* and 56*b*, respectively, to perform independent functions.

The peripheral regions 44*a* and 44*b* or 54*a* and 54*b* are formed around the memory cell regions 42*a* and 42*b* or 52*a* and 52*b*, respectively. Specifically, the peripheral region 44*a* and 44*b* or 54*a* and 54*b* can be disposed in each of row and column directions of the memory cell regions 42*a* and 42*b* or 52*a* and 52*b*.

The pad regions 46*a* and 46*b* or 56*a* and 56*b* connected to the memory cell regions 42*a* and 42*b* or 52*a* and 52*b*, respectively, can be arranged adjacent to each other in the semiconductor chip 40 or 50 (depending on the embodiment). Specifically, the pad region 46*a*, 46*b*, 56*a* or 56*b* may be disposed adjacent to a corner of the memory cell region 42*a*, 42*b*, 52*a* or 52*b* or between the peripheral regions 44*a*, 44*b*, 54*a* or 54*b*.

Accordingly, if the memory cell regions 42*a* and 42*b* or 52*a* and 52*b* are arranged in the row direction of the semiconductor chip 40 or 50, the pad regions 46*a* and 46*b* or 56*a* and 56*b* may be also be arranged in the row direction thereof. However, if the memory cell regions 42*a* and 42*b* or 52*a* and 52*b* are arranged in the column direction of the semiconductor chip 40 or 50, the pad regions 46*a* and 46*b* or 56*a* and 56*b* may be also be arranged in the column direction thereof.

Figure 8C:
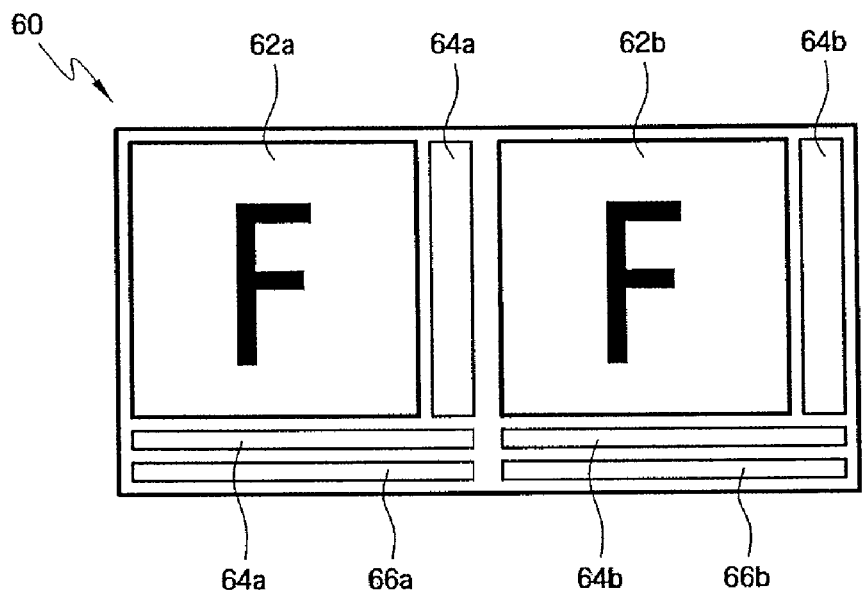
Figure 8D:
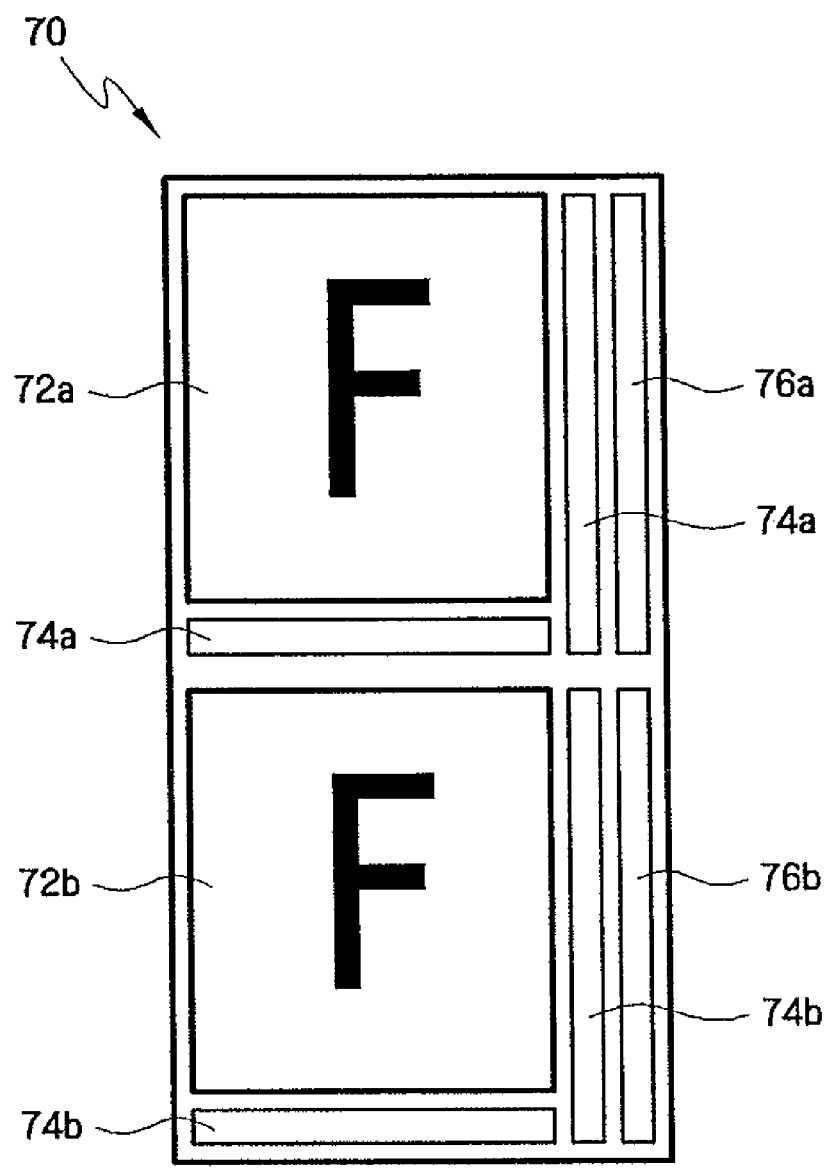

Referring to FIGS. 8C and 8D, two memory cell regions 62*a* and 62*b* or 72*a* and 72*b* can be disposed in a row or column direction of each of the semiconductor chips 60 and 70 of FIGS. 8C and 8D, respectively. In addition, peripheral regions 64*a* and 64*b* or 74*a* and 74*b* can be formed around the memory cell regions 62*a* and 62*b* or 72*a* and 72*b*, respectively.

Pad regions 66*a* and 66*b* or 76*a* and 76*b* can be disposed adjacent to each other in an edge region of the semiconductor chip 60 or 70, respectively. That is, the pad region 66*a* and 66*b* or 76*a* and 76*b* can be disposed parallel to a row or column direction of each of the memory cell regions 62*a* and 62*b* or 72*a* and 72*b*, respectively.

As shown in FIGS. 8A through 8D, when the memory cell regions 42*a* and 42*b*, 52*a* and 52*b*, 62*a* and 62*b*, and 72*a* and 72*b* are formed in each of their respective semiconductor chips 40, 50, 60 and 70, their respective pad regions 46*a* and 46*b*, 56*a* and 56*b*, 66*a* and 66*b*, and 76*a* and 76*b* can be arranged in the edge region of each of their respective semiconductor chips 40, 50, 60 and 70.

Accordingly, the semiconductor chips 40, 50, 60 and 70 (see FIG. 7), having the same pattern direction, can be formed on the semiconductor substrate 2 (see FIG. 7) using a single mask. In addition, since the pad regions 46*a* and 46*b*, 56*a* and 56*b*, 66*a* and 66*b*, and 76*a* and 76*b* are arranged in the edge region of each of their respective semiconductor chips 40, 50, 60 and 70, their positions can be easily changed when the semiconductor chips 40, 50, 60, and 70 are assembled into a semiconductor package.

Any one of the semiconductor chips 40, 50, 60, and 70 of FIG. 8A, 8B, 8C or 8D, can be repeatedly formed on the semiconductor substrate 2, as shown in FIG. 7. After such formation, the semiconductor chips 40, 50, 60, or 70 on semiconductor substrate 2 are tested in order to determine whether they are defective.

Figure 9:
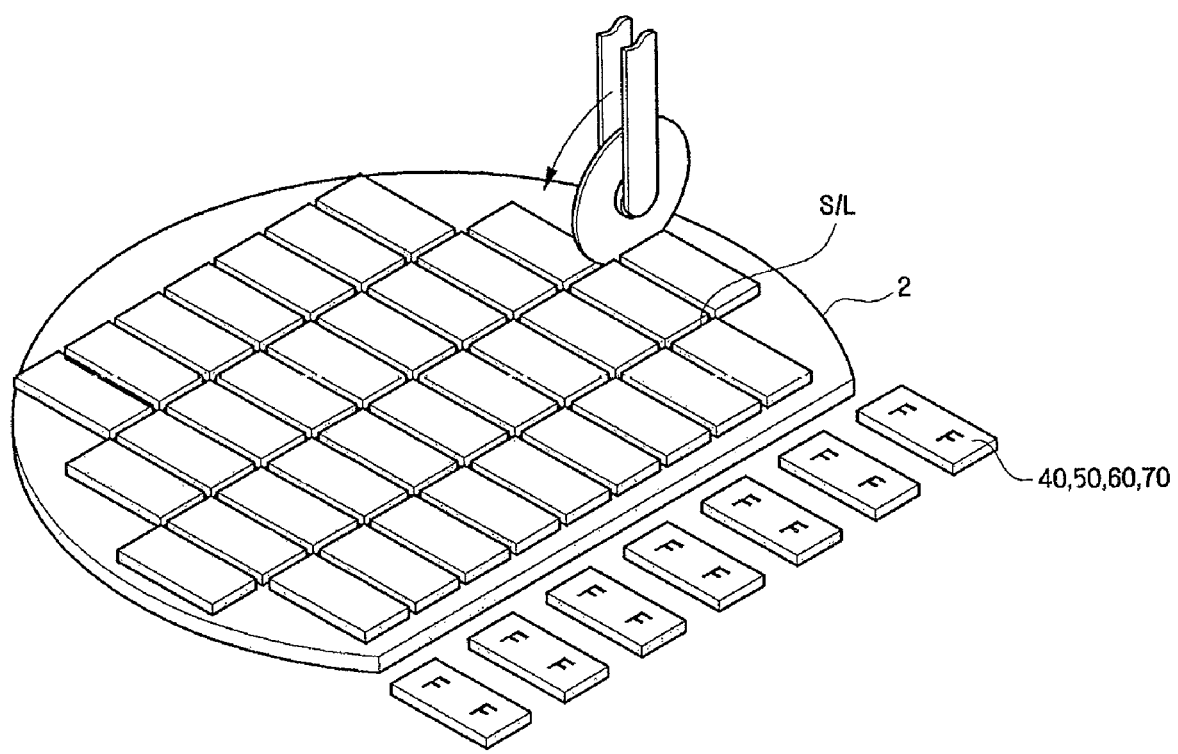
FIG. 9 shows an exemplary embodiment of a process of separating semiconductor chips from one another according to another aspect of the present invention.

Then, the semiconductor chips 40, 50, 60 or 70 (depending on the embodiment) formed on the semiconductor substrate 2 are separated from one another as shown in FIG. 9. FIG. 9 shows an exemplary embodiment of a process of separating semiconductor chips 40, 50, 60 or 70 from one another according to another aspect of the present invention.

Referring to FIG. 9, the semiconductor chips 40, 50, 60 or 70 are separated from one another along a scribe line S/L on a semiconductor substrate 2 using a dicing apparatus (not in the art). Then, only non-defective ones of the separated semiconductor chips 40, 50, 60 or 70 are packaged to manufacture a semiconductor package.

A method of packaging the semiconductor chips 40, 50, 60 or 70, which are formed on the semiconductor substrate 2 and then separated from one another, to manufacture a center-pad type semiconductor package will now be described in detail.

FIGS. 10A through 10D are plan views of exemplary embodiments of center-pad type semiconductor packages 400a, 500a, 600a, and 700a according to another aspect of the present invention.

When a plurality of semiconductor chips are bonded onto a package substrate, the number of semiconductor chips that can be bonded onto the package substrate can be determined by the desired capacity of the semiconductor package. In addition, the capacity of each semiconductor chip can dictate the number of semiconductor chips that can be bonded onto the package substrate.

In the exemplary embodiments provided herein, a case where 512 M byte semiconductor chips are packaged to manufacture a 1 G byte semiconductor package will be described.

Referring to FIGS. 10A through 10D, from among a plurality of semiconductor chips (indicated by reference numeral 40, 50, 60, 70 in FIG. 7), which have the same pattern direction and are formed on a semiconductor substrate (indicated by reference numeral 2 in FIG. 7), two first chips 40_1, 50_1, 60_1 or 70_1 are bonded to specified regions of a package substrate 410a, 510a, 610a or 710a, in FIGS. 10A-D respectively. Here, pad regions 46a_1 and 46b_1, 56a_1 and 56b_1, 66a_1 and 66b_1 or 76a_1 and 76b_1 of the first chips 40_1, 50_1, 60_1 or 70_1 must be placed in a center region of the package substrate 410a, 510a, 610a or 710a.

From among the semiconductor chips 40, 50, 60 or 70 which are formed on the semiconductor substrate (indicated by reference numeral 2 in FIG. 7) and then separated from one another, two second chips 40_2, 50_2, 60_2 or 70_2 are rotated 180 degrees with respect to the first chips 40_1, 50_1, 60_1 or 70_1 and placed on sides of the first chips 40_1, 50_1, 60_1 or 70_1, respectively. That is, each of the second chips 40_2, 50_2, 60_2 or 70_2 is rotated and placed on a side of each of the pad regions 46a_1 and 46b_1, 56a_1 and 56b_1, 66a_1 and 66b_1 or 76a_1 and 76b_1 of the first chips 40_1, 50_1, 60_1 or 70_1. Here, the first chips 40_1, 50_1, 60_1 or 70_1 and the second chips 40_2, 50_2, 60_2 or 70_2 may be separated from each other with a predetermined gap therebetween.

Figure 10A:
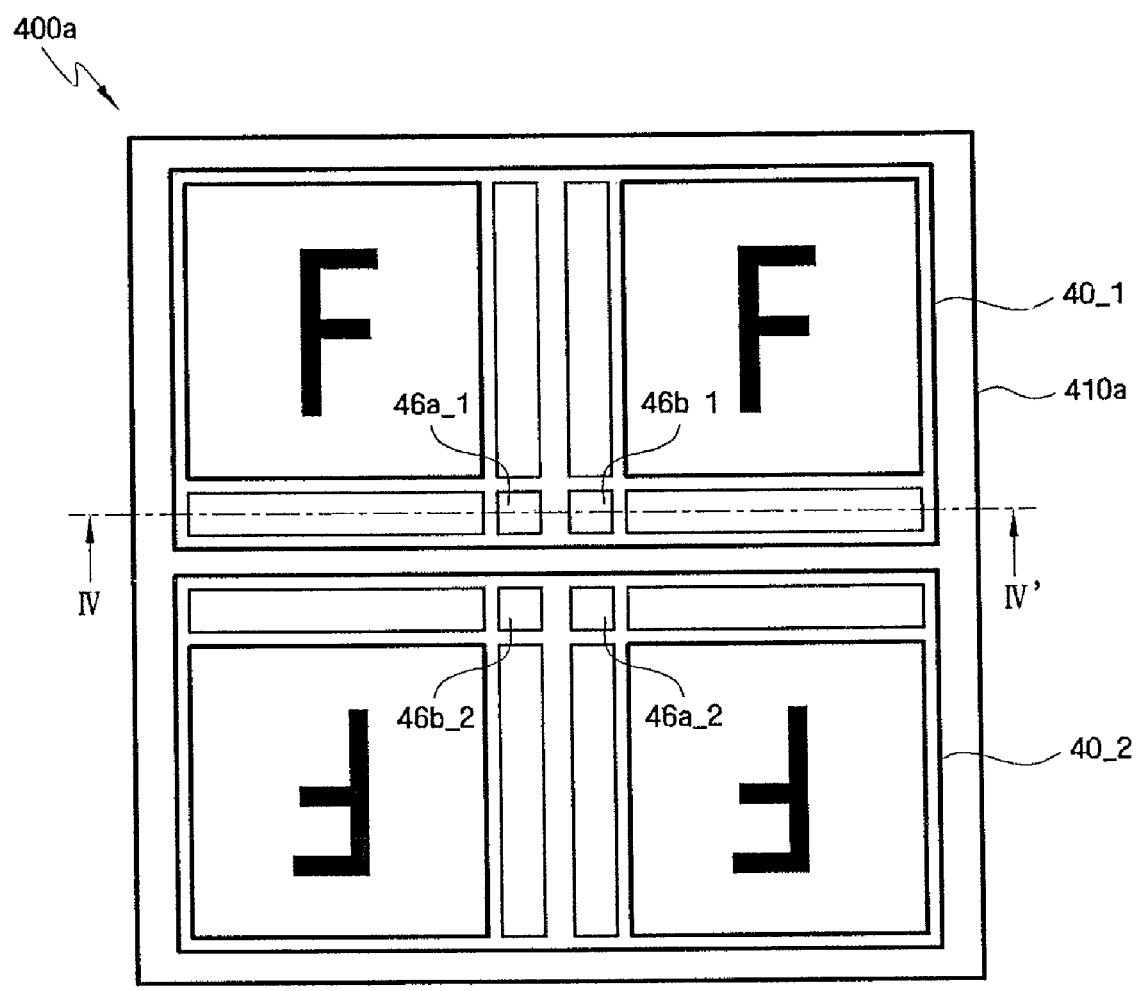
FIGS. 10A through 10D are plan views of exemplary embodiments of center-pad type semiconductor packages according to other aspects of the present invention.
Figure 10B:
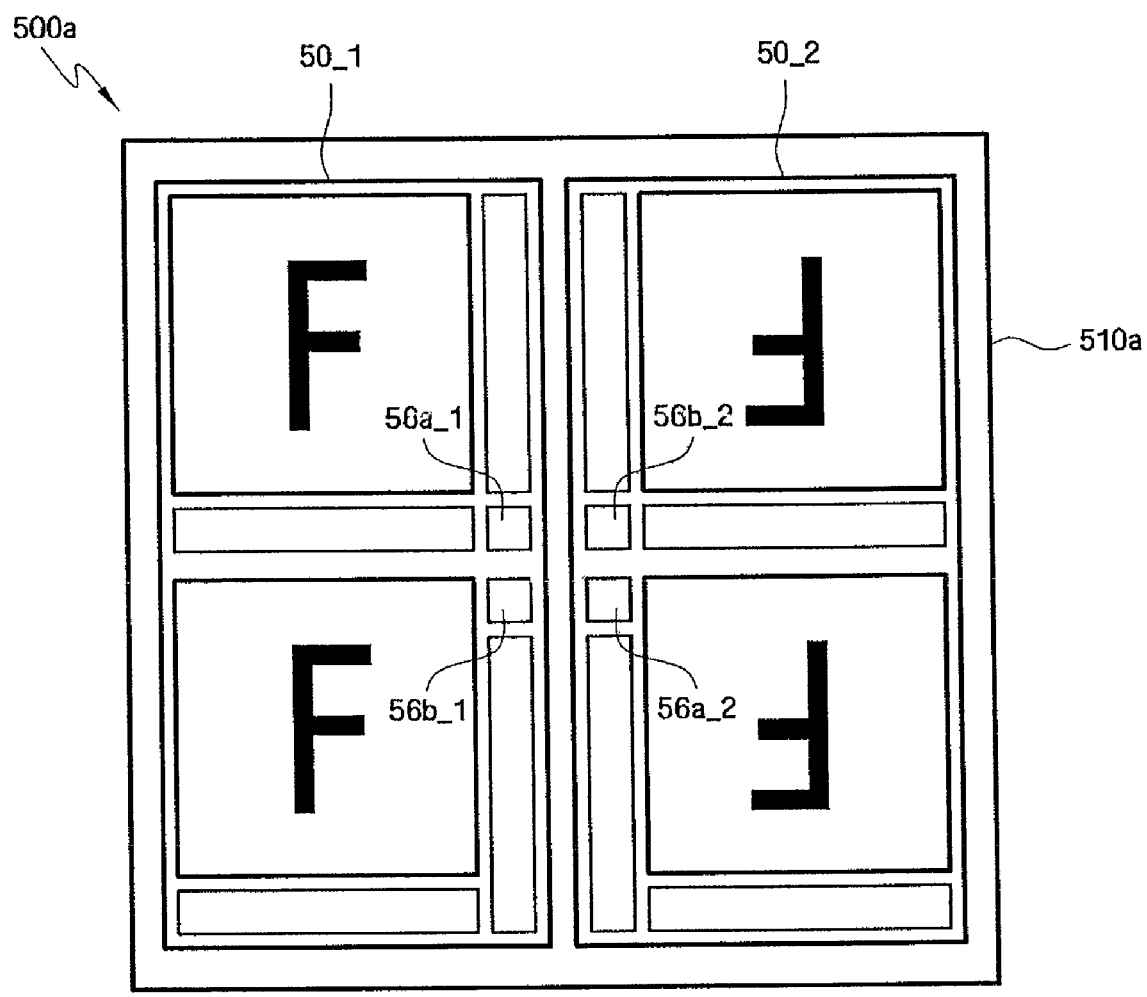
Figure 10C:
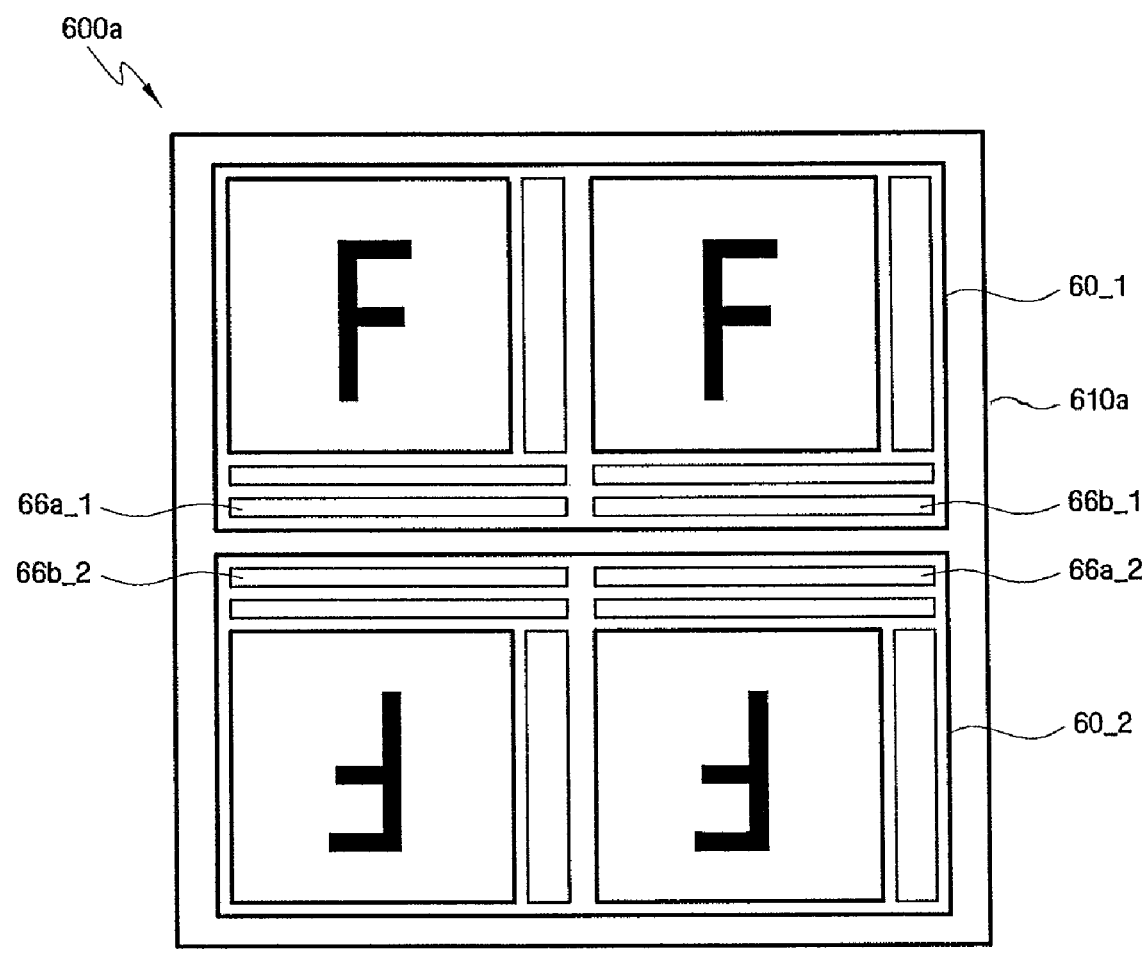
Figure 10D:
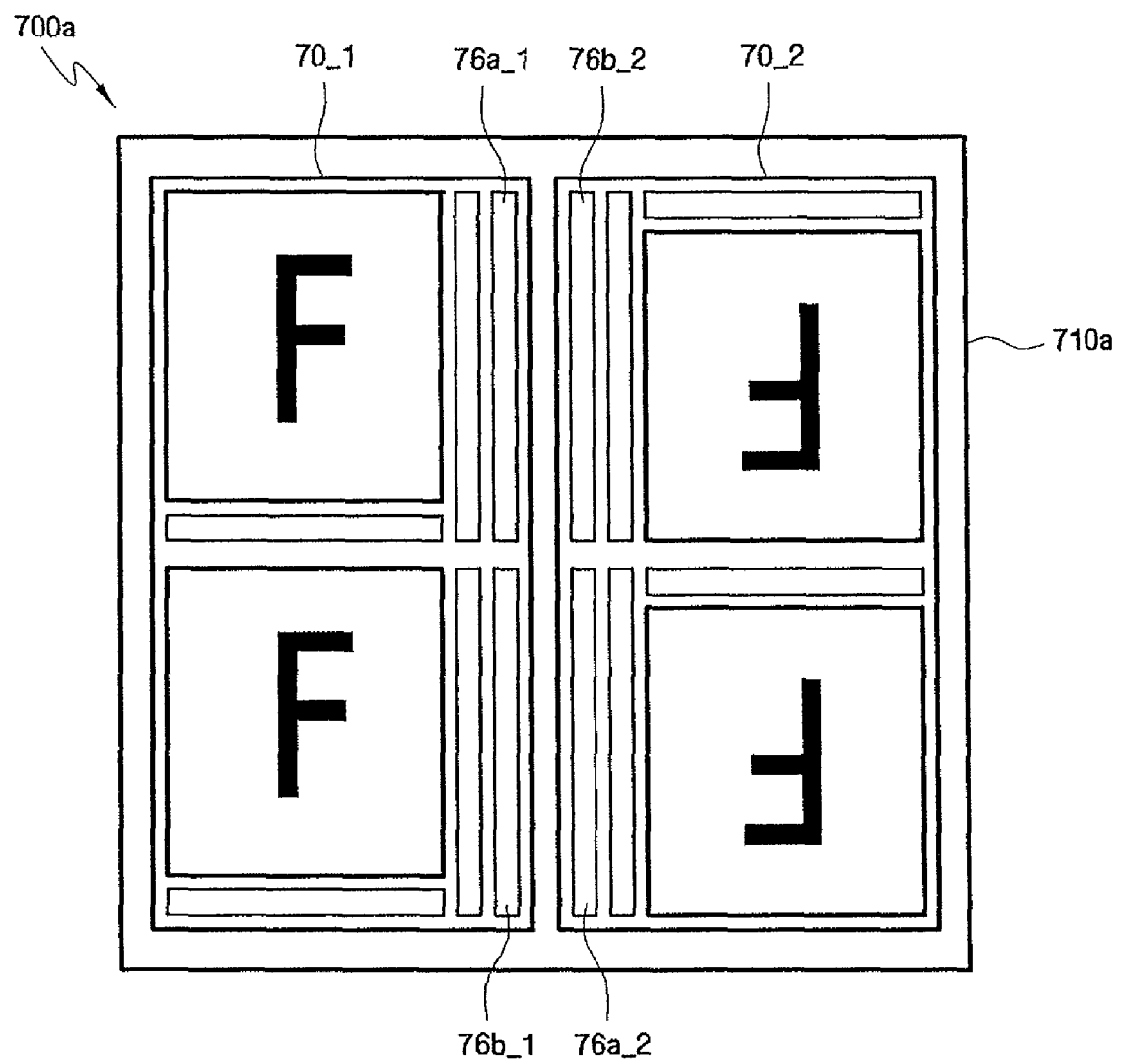
Figure 11A:
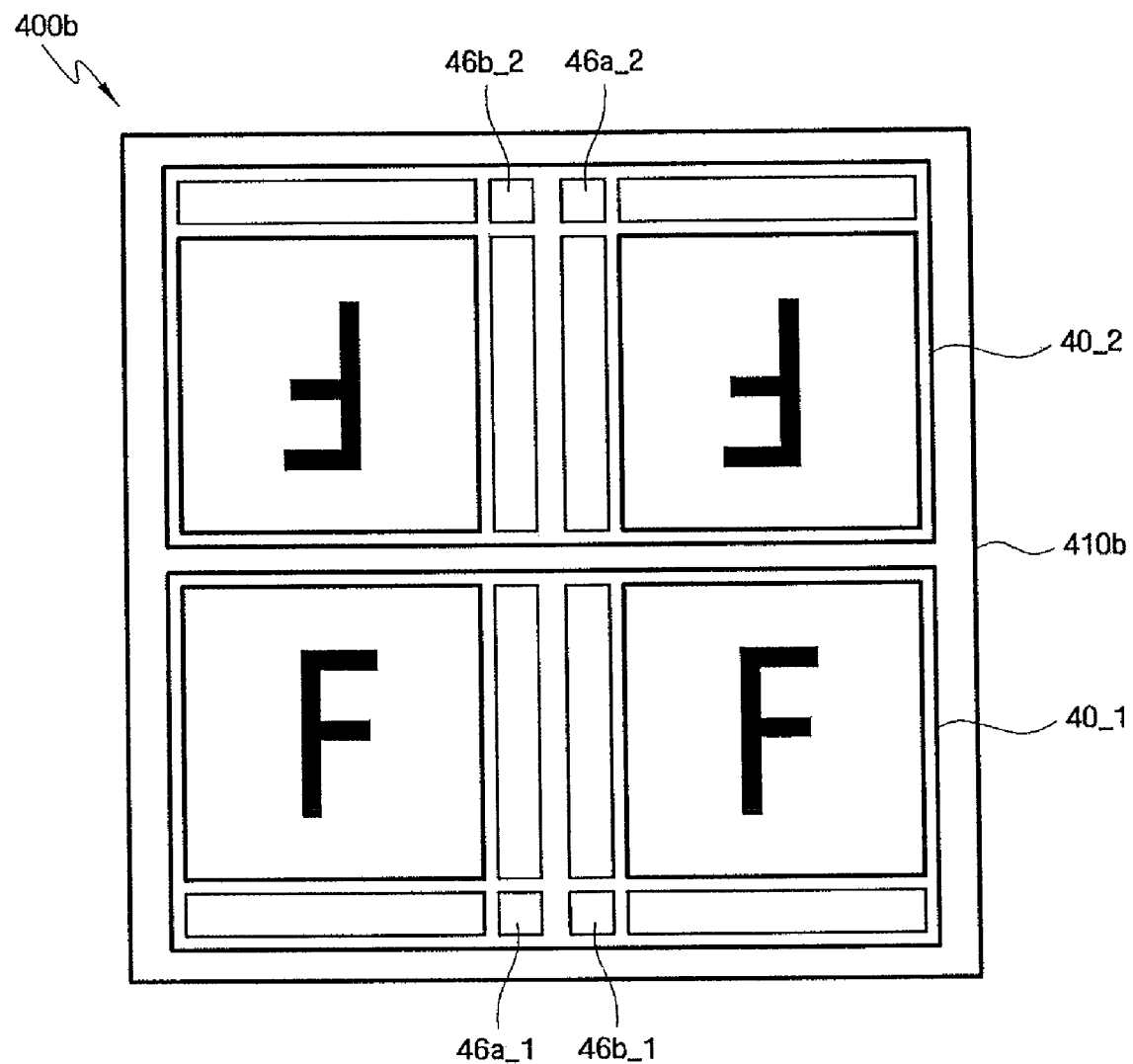
FIGS. 11A through 11D are plan views of exemplary embodiments of edge-pad type semiconductor packages according to other aspects of the present invention.
Figure 11B:
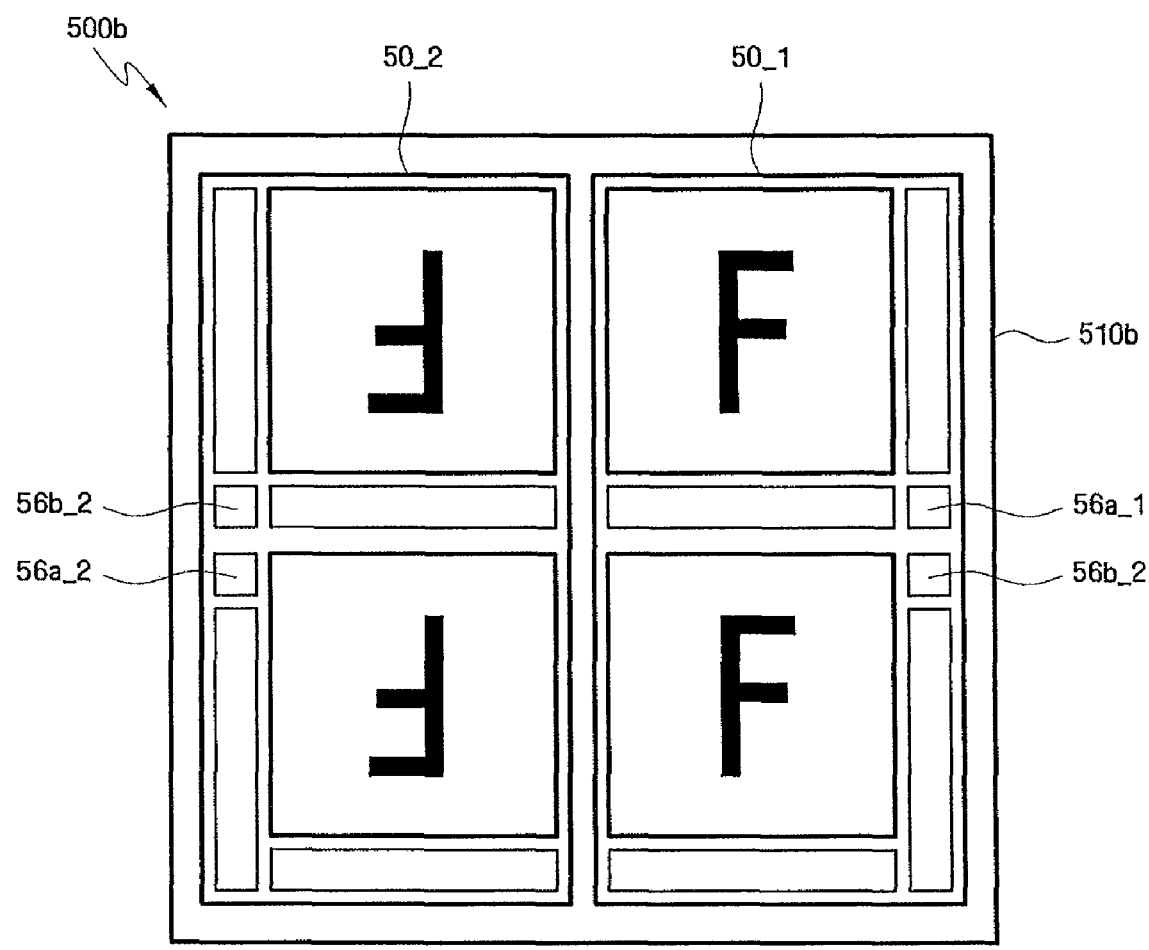
Figure 11C:
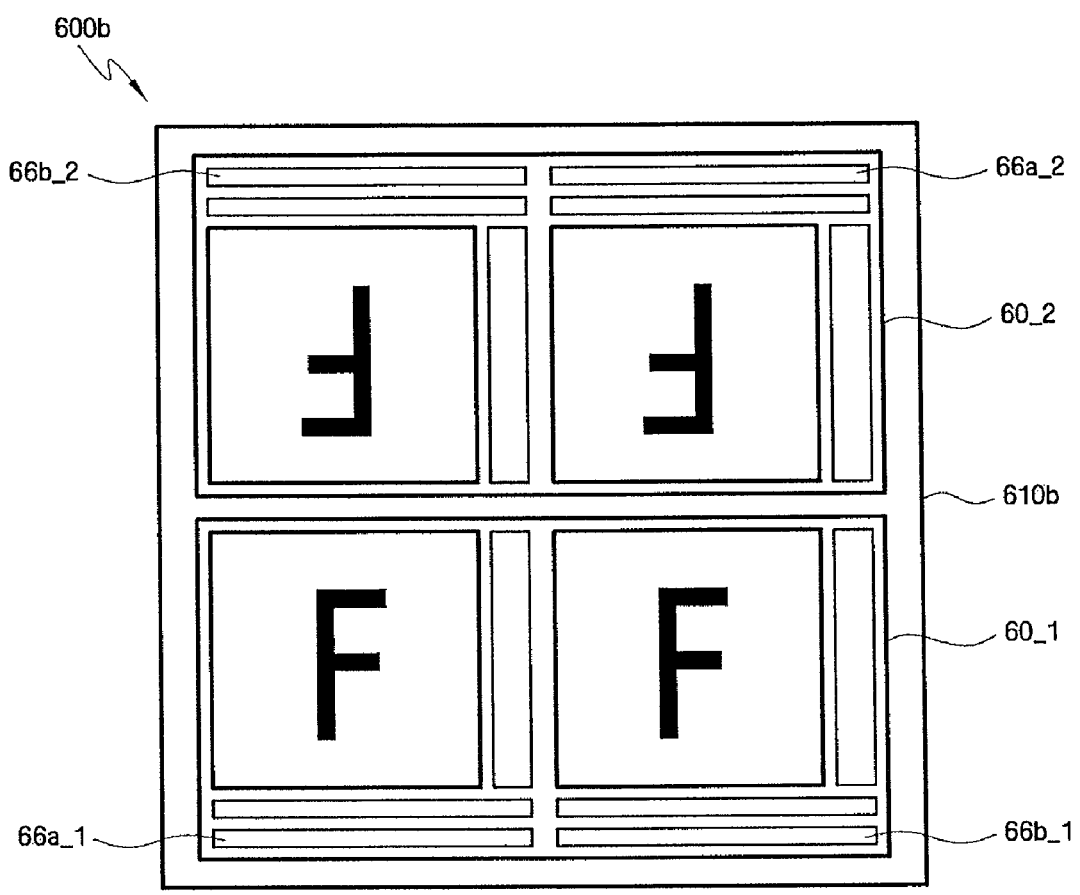
Figure 11D:
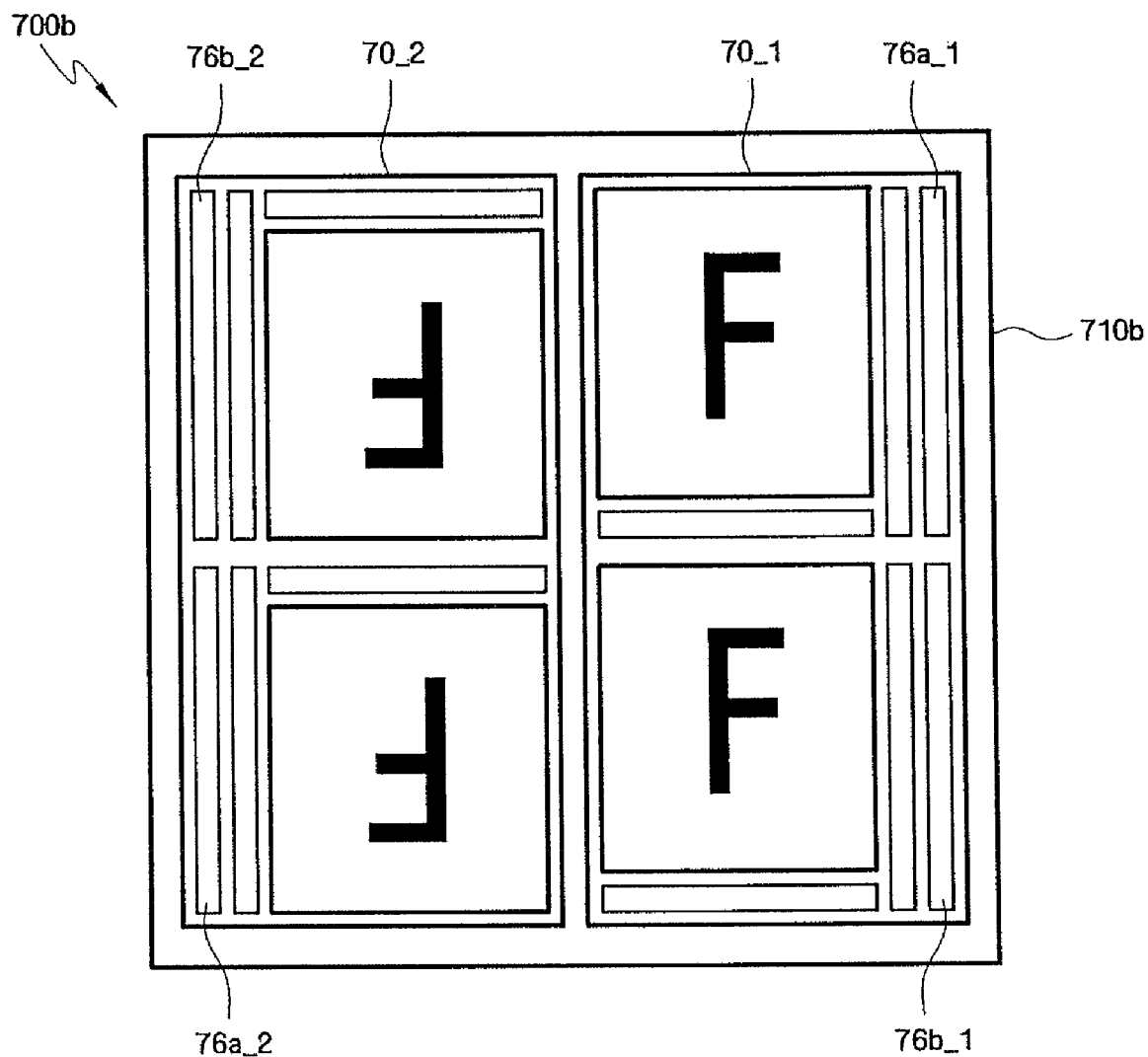

When the semiconductor chips 40, 50, 60 or 70 are bonded onto the package substrate 410a, 510a, 610a or 710a as described above, the pad regions 46a_1, 46b_1, 46a_2 and 46b_2 or 56a_1, 56b_1, 56a_2 and 56b_2 can be concentrated in the center region of the package substrate 410a or 510a as shown in FIG. 10A or 10B. Alternatively, the pad regions 66a_1, 66b_1, 66a_2 and 66b_2 or 76a_1, 76b_1, 76a_2 and 76b_2 can extend across the center region of the package substrate 610a or 710a as shown in FIG. 10C or 10D.

A cross-sectional structure of each of the semiconductor packages 400a, 500a, 600a, and 700a shown in FIGS. 10A through 10D is identical to that of the semiconductor package 100a, 200a, 300a shown in FIG. 5, so a detailed description thereof will be omitted. That is, each of semiconductor packages 400a, 500a, 600a, and 700a have the same cross-sectional view when taken along a line IV-IV' of FIG. 10A, or line similarly positioned in FIGS. 10B through 10D, as in FIG. 5.

As described above, when the semiconductor chips 40, 50, 60 or 70 are disposed on a top surface of the package substrate 410a, 510a, 610a or 710a (depending on the embodiment), the pad regions of the semiconductor chips 40, 50, 60 or 70 can be arranged in the center region of the package substrate 410a, 510a, 610a or 710a to easily implement the center-pad type semiconductor package 400a, 500a, 600a or 700a. In addition, the number of processes and costs required to form the semiconductor chips 40, 50, 60 or 70 on the semiconductor substrate 2 can be reduced, and the yields of the semiconductor chips 40, 50, 60 or 70 on each semiconductor substrate 2 can be increased.

Meanwhile, the semiconductor chips 40, 50, 60 or 70 (see FIG. 9), which are formed on the semiconductor substrate 2 (see FIG. 9) and then separated from one another, may be packaged to implement an edge-pad type semiconductor package.

FIGS. 11A through 11D are plan views of exemplary embodiments of edge-pad type semiconductor packages 400b, 500b, 600b, and 700b according to another aspect of the present invention.

Referring to FIGS. 11A through 11D, from among a plurality of semiconductor chips (indicated by reference numeral 40, 50, 60 or 70 in FIG. 7), which have the same pattern direction and are formed on a semiconductor substrate (indicated by reference numeral 2 in FIG. 7), two first chips 40_1, 50_1, 60_1 or 70_1 are bonded to specified regions of a package substrate 410b, 510b, 610b or 710b. Here, pad regions 46a_1 and 46b_1, 56a_1 and 56b_1, 66a_1 and 66b_1 or 76a_1 and 76b_1 of the first chips 40_1, 50_1, 60_1 or 70_1 are placed in an edge region of the package substrate 410b, 510b, 610b or 710b.

From among the semiconductor chips 40, 50, 60 or 70 which are formed on the semiconductor substrate 2 and then separated from one another, two second chips 40_2, 50_2, 60_2 or 70_2 are rotated 180 degrees with respect to the first chips 40_1, 50_1, 60_1 or 70_1 and placed on sides of the first chips 40_1, 50_1, 60_1 or 70_1, respectively. That is, pad regions 46a_2 and 46b_2, 56a_2 and 56b_2, 66a_2 and 66b_2 or 76a_2 and 76b_2 of the second chips 40_2, 50_2, 60_2 or 70_2 are separated from the pad regions 46a_1 and 46b_1, 56a_1 and 56b_1, 66a_1 and 66b_1 or 76a_1 and 76b_1 of the first chips 40_1, 50_1, 60_1 or 70_1, respectively, in the edge region of the package substrate 410b, 510b, 610b or 710b.

As described above, an edge-pad type package can be easily implemented by changing the pattern directions of a plurality of semiconductor chips and arranging pad regions of the semiconductor chips in an edge region of a package substrate.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of manufacturing a semiconductor package, the method comprising:

forming a plurality of semiconductor chips (F) having the same pattern direction on a semiconductor substrate, wherein each of the semiconductor chips comprises a memory cell region, a peripheral region, and a pad region, wherein the pad region of each semiconductor chip is disposed at a corner of the semiconductor chip;

separating each of the plurality of semiconductor chips from one another; and disposing selected semiconductor chips, from the separated semiconductor chips, on a package substrate, including changing the pattern directions of a subset of the selected semiconductor chips such that the relative orientations of each semiconductor chip in the subset of the selected semiconductor chips is different on the package substrate than it was on the semiconductor substrate and the pad regions of the selected semiconductor chips are arranged to be adjacent to each other in a center region of the package substrate located between the selected semiconductor chips, wherein forming each of the plurality of semiconductor chips comprises:

forming the memory cell region in a center region of the semiconductor chip;

forming the peripheral region in each of row and column directions of the memory cell region; and forming the pad region adjacent to a corner of the memory cell region; and wherein disposing selected semiconductor chips on the package substrate comprises:

disposing a first semiconductor chip, from the selected semiconductor chips, on the package substrate such that a pad region of the first semiconductor chip is placed in the center region of the package substrate; and rotating a second semiconductor chip, from the selected semiconductor chips, at least 90 degrees with respect to the first semiconductor chip and disposing the second semiconductor chip such that a pad region of the second semiconductor chip is adjacent to the pad region of the first semiconductor chip.

2. The method of claim 1, wherein disposing the selected semiconductor chips on the package substrate further comprises rotating a third semiconductor chip, from the selected semiconductor chips, 180 degrees with respect to the first semiconductor chip and disposing the third semiconductor chip such that a pad region of the third chip is adjacent to the pad region of the second semiconductor chip.

3. The method of claim 2, wherein disposing the selected semiconductor chips on the package substrate further comprises rotating a fourth semiconductor chip, from the selected semiconductor chips, 270 degrees with respect to the first semiconductor chip and disposing the fourth semiconductor chip such that a pad region of the fourth semiconductor chip is adjacent to the pad region of the third semiconductor chip.

4. The method of claim 1, wherein forming each of the plurality of semiconductor chips comprises:

forming a plurality of memory cell regions in a line in each semiconductor chip;

forming a peripheral region in each of row and column directions of each of the plurality of memory cell regions; and forming a pad region adjacent to a corner of each of the plurality of memory cell regions, wherein the pad regions are adjacent to each other.

5. The method of claim 4, wherein disposing the selected semiconductor chips on the package substrate comprises:

rotating the second semiconductor chip, from the selected semiconductor chips, 180 degrees with respect to the first semiconductor chip and disposing the second semiconductor chip such that a pad region of the second semiconductor chip is adjacent to the pad region of the first semiconductor chip.

* * * * *